(12) United States Patent
Kim et al.

(10) Patent No.: US 11,728,160 B2
(45) Date of Patent: *Aug. 15, 2023

(54) METHOD OF FORMING OXIDE FILM INCLUDING TWO NON-OXYGEN ELEMENTS, METHOD OF MANUFACTURING SEMICONDUCTOR DEVICE, METHOD OF FORMING DIELECTRIC FILM, AND SEMICONDUCTOR DEVICE

(71) Applicant: Samsung Electronics Co., Ltd., Suwon-si (KR)

(72) Inventors: Younsoo Kim, Yongin-si (KR); Haeryong Kim, Seongnam-si (KR); Seungmin Ryu, Hwaseong-si (KR); Sunmin Moon, Yongin-si (KR); Jeonggyu Song, Seongnam-si (KR); Changsu Woo, Seoul (KR); Kyooho Jung, Seoul (KR); Younjoung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

This patent is subject to a terminal disclaimer.

(21) Appl. No.: 17/376,403

(22) Filed: Jul. 15, 2021

(65) Prior Publication Data
US 2021/0343524 A1 Nov. 4, 2021

Related U.S. Application Data

(63) Continuation of application No. 16/791,189, filed on Feb. 14, 2020, now Pat. No. 11,081,338.

(30) Foreign Application Priority Data

Jul. 26, 2019 (KR) .................. 10-2019-0091159

(51) Int. Cl.
H01L 21/02 (2006.01)

(52) U.S. Cl.
CPC .... H01L 21/02164 (2013.01); H01L 21/0228 (2013.01)

(58) Field of Classification Search
None
See application file for complete search history.

(56) References Cited

U.S. PATENT DOCUMENTS 6,887,523 B2   5/2005   Zhuang et al.
7,135,207 B2   11/2006  Min et al.
(Continued)

FOREIGN PATENT DOCUMENTS

KR   10-2005-0037253 A   4/2005

OTHER PUBLICATIONS

Notice of Allowance dated Mar. 31, 2021, issued in corresponding U.S. Appl. No. 16/791,189.

*Primary Examiner* — Asok K Sarkar
(74) *Attorney, Agent, or Firm* — Harness, Dickey & Pierce, P.L.C.

(57) ABSTRACT

A method of forming an oxide film including two non-oxygen elements includes providing a first source material on a substrate, the first source material including a first central element, providing an electron donor compound to be bonded to the first source material, providing a second source material on the substrate after the providing of the electron donor compound, the second source material including a second central element, and providing an oxidant on the substrate.

20 Claims, 26 Drawing Sheets

(56) References Cited

U.S. PATENT DOCUMENTS

| | | |
|---|---|---|
| 7,825,043 B2 | 11/2010 | Lee |
| 8,288,241 B2 | 10/2012 | Hirota et al. |
| 8,603,877 B2 | 12/2013 | Rocklein et al. |
| 8,613,975 B2 | 12/2013 | Chalker et al. |
| 11,081,338 B2 * | 8/2021 | Kim .................... H01L 21/0228 |
| 2006/0088660 A1 | 4/2006 | Putkonen et al. |
| 2012/0145953 A1 | 6/2012 | Pallem et al. |
| 2013/0288427 A1 | 10/2013 | Hung et al. |

\* cited by examiner

METHOD OF FORMING OXIDE FILM INCLUDING TWO NON-OXYGEN ELEMENTS, METHOD OF MANUFACTURING SEMICONDUCTOR DEVICE, METHOD OF FORMING DIELECTRIC FILM, AND SEMICONDUCTOR DEVICE

CROSS-REFERENCE TO RELATED APPLICATION

This is a continuation of U.S. application Ser. No. 16/791,189, filed Feb. 14, 2020, which claims priority to Korean Application No. 10-2019-0091159, filed on Jul. 26, 2019, the disclosures of each of which are hereby incorporated by reference in their entirety.

BACKGROUND

The inventive concepts relate to a method of forming an oxide film including two non-oxygen elements, a method of manufacturing a semiconductor device, a method of forming a dielectric film, and a semiconductor device, and more particularly, to a method of manufacturing a high-aspect-ratio material film including at least two materials to have a high uniformity in terms of composition and dimensions and a semiconductor device manufactured by using the method.

As the complexity of semiconductor devices advances and the demands on performance of semiconductor devices grow, it may be advantageous to form oxide material films with at least two metals or semimetals with good or high uniformity in terms of composition and dimensions. In particular, as an aspect ratio of a feature on which a material film is to be deposited is greatly increased, it may become more difficult to meet the above-described needs.

SUMMARY

The inventive concepts provide a method of forming an oxide film, by which a high-aspect-ratio material film including at least two materials may be formed to have high uniformity in terms of composition and dimensions.

The inventive concepts also provide a method of manufacturing a semiconductor device, by which a high-aspect-ratio material film including at least two materials may be formed to have a high uniformity in terms of composition and dimensions.

In addition, the inventive concepts provide a method of forming a dielectric film, by which a high-aspect-ratio material film including at least two materials may be formed to have a high uniformity in terms of composition and dimensions.

Furthermore, the inventive concepts provide a semiconductor device including a high-aspect-ratio material film including at least two materials, and the high-aspect-ratio material film may have a high uniformity in terms of composition and dimensions.

According to an aspect of the inventive concepts, there is provided a method of forming an oxide film including two non-oxygen elements. The method includes providing a first source material including a first central element on a substrate, providing an electron donor compound to be bonded to the first source material, providing a second source material including a second central element on the substrate after the providing of the electron donor compound, and providing an oxidant on the substrate.

According to another aspect of the inventive concepts, there is provided a method of manufacturing a semiconductor device. The method includes forming a lower electrode that is electrically connected to an active region of a semiconductor substrate, forming a dielectric film on an entire exposed surface of the lower electrode, and forming an upper electrode on the dielectric film. The formation of the dielectric film includes providing a first source material on the exposed surface of the lower electrode, providing an electron donor compound that is capable of forming a van der Waals bond with the first source material, providing a second source material on the lower electrode after the providing of the electron donor compound, and providing an oxidant on the lower electrode.

According to another aspect of the inventive concepts, there is provided a method of forming a dielectric film. The method includes providing a substrate into a reaction chamber, providing a first electron donor compound on the substrate, and repeating a deposition cycle until an oxide film is formed on the substrate to a set thickness. The deposition cycle includes providing a first source material including a first central element on the substrate, providing a second electron donor compound to be bonded to the first source material, providing a second source material including a second central element on the substrate after the providing of the second electron donor compound, and providing an oxidant on the substrate.

According to another aspect of the inventive concepts, there is provided a semiconductor device including at least two lower electrodes formed on a substrate, a dielectric film formed on surfaces of the at least two lower electrodes, the dielectric film including at least two metal elements or semimetal elements, and an upper electrode formed on the dielectric film and electrically insulated from the at least two lower electrodes. An aspect ratio of the lower electrode ranges from about 30 to about 200, and a ratio of a smallest thickness of the dielectric film to a greatest thickness of the dielectric film is 0.93 or higher.

BRIEF DESCRIPTION OF THE DRAWINGS

Example embodiments of the inventive concepts will be more clearly understood from the following detailed description taken in conjunction with the accompanying drawings in which:

FIGS. 10A to 10C are diagrams illustrating a method of manufacturing a semiconductor device, according to an example embodiment, wherein FIG. 10A is a plan view of the semiconductor device to be formed, FIG. 10B is a perspective view of the semiconductor device of FIG. 10A, and FIG. 10C is a cross-sectional view of sectional structures taken along lines X-X' and Y-Y' of FIG. 10A.

DETAILED DESCRIPTION OF EXAMPLE EMBODIMENTS

Figure 1:
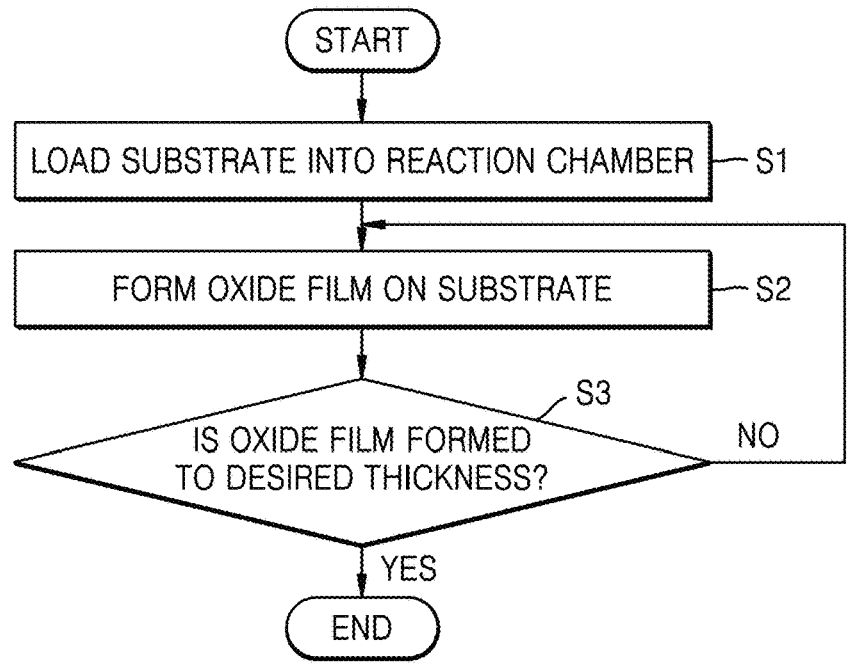
FIG. 1 is a flowchart of a method of forming an oxide film, according to an example embodiment.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, example embodiments will be described in detail with reference to the accompanying drawings. The same reference numerals are used to denote the same elements in the drawings, and repeated descriptions thereof will be omitted.

FIG. 1 is a flowchart of a method of forming an oxide film, according to an example embodiment.

Referring to FIG. 1, a substrate may be loaded into a reaction chamber (S1). The substrate may include a semiconductor substrate including a semiconductor element (e.g., silicon (Si) or germanium (Ge)) or a compound semiconductor (e.g., silicon carbide (SiC), gallium arsenide (GaAs), indium arsenide (InAs), or indium phosphide (InP)). In some example embodiments, the substrate may include a semiconductor substrate, at least one insulating film formed on the semiconductor substrate, and/or structures including at least one conductive region. The conductive region may include, for example, a doped well, a doped structure, and/or a metal-containing conductive layer. Also, the substrate may have one of various device isolation structures, such as a shallow trench isolation (STI) structure.

An oxide film may be formed on the substrate loaded into the reaction chamber (S2). The oxide film may include a metal oxide and/or a semimetal oxide.

In some example embodiments, the oxide film may contain at least two metals and/or semimetals, such as $M_xM'_yO_z$. Here, each of M and M' may independently represent a metal or semimetal and may include at least one selected from beryllium (Be), boron (B), sodium (Na), magnesium (Mg), aluminum (Al), silicon (Si), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), tellurium (Te), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), Francium (Fr), radium (Ra), actinium (Ac), thorium (Th), protactinium (Pa), and uranium (U). Each of x, y, and z represent relative contents of M, M', and oxygen, respectively. Each of x, y, and z is a real number greater than zero (0) and not specifically limited.

For example, the oxide film may include a zirconium-silicon oxide film, a hafnium-silicon oxide film, an aluminum-silicon oxide film, a lanthanum-silicon oxide film, a tantalum-silicon oxide film, or a combination thereof.

The oxide film manufactured by a method of forming an oxide film, according to example embodiments, may be used for various purposes. For example, the oxide film manufactured by the method of forming the oxide film, according to the example embodiments, may be used for a dielectric layer included in a capacitor of a semiconductor memory device, a gate dielectric layer of a planar transistor, a dielectric film of a vertical NAND flash memory device, a conductive barrier layer used for an interconnection, a resistive layer, a magnetic layer, a liquid-crystal (LC) barrier metal layer, a member for a thin-film solar cell, a member for semiconductor equipment, a nanostructure, a hydrogen storage alloy, and a microelectromechanical (MEMS) actuator, but example embodiments of the inventive concepts are not limited thereto.

Thereafter, it may be determined whether the oxide film has been formed to a desired thickness (S3). The desired thickness of the oxide film may be, for example, a set thickness and may be set by restrictions on size or to improve or optimize the functionality of the oxide film. The desired thickness may be a preset value and by related to restrictions or limitations of the processing process, including but not limited to, an aspect ratio of the substrate, time restraints, topographical restraints, and material costs. When the oxide film has been formed to a thickness less than the desired thickness, operation S2 of forming the oxide film may be repeated. When the oxide film has been formed to the desired thickness or more, the repeated operation of forming an oxide film may be completed or interrupted.

Figure 2:
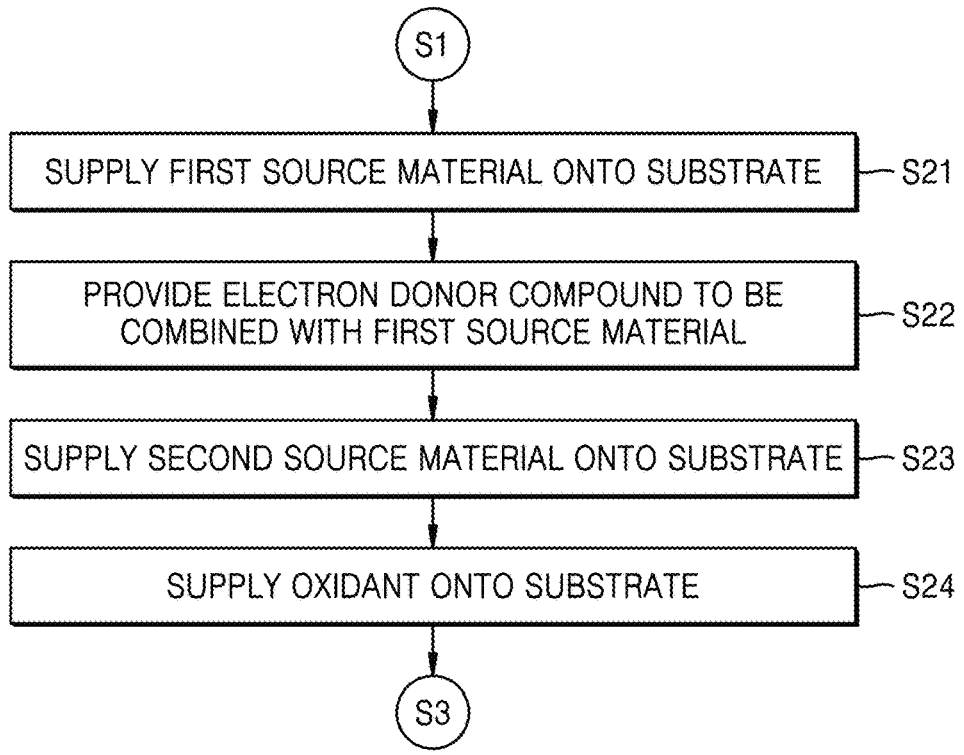
FIG. 2 is a detailed flowchart of operation of forming an oxide film on a substrate, according to an example embodiment.

FIG. 2 is a detailed flowchart of operation S2 of forming an oxide film on the substrate 100, according to an example embodiment. FIGS. 3A to 3D are schematic conceptual diagrams illustrating a mechanism of uniformly forming an oxide film on the substrate 100.

Figure 3A:
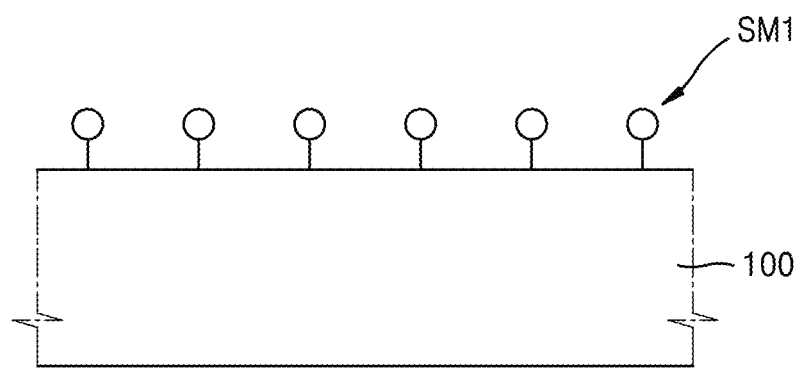
FIGS. 3A to 3D are schematic conceptual diagrams illustrating a mechanism of uniformly forming an oxide film on a substrate.

Referring to FIGS. 2 and 3A, a first source material SM1 may be provided on the substrate 100 (S21). The first source material SM1 may be a precursor material, which includes a first central element. The first central elements may be a metal or semimetal forming an oxide film to be deposited.

In some example embodiments, the first source material SM1 may be a material that is denoted by $ML_n$. Here, M denotes a first central element, which is a central element of the first source material SM1, and L denotes a ligand bonded to the central element M of the first source material SM1. Also, n denotes a number determined by the first central element M and the ligand L and is, for example, an integer ranging from 2 to 6. Since the first central element M is a metal or a semimetal as described above, additional descriptions thereof are omitted.

In some example embodiments, the first source material SM1 may be a material that is denoted by $M(L^a)_n(L^b)_m$. Here, $L^a$ denotes a first ligand bonded to the central element M, and $L^b$ is a second ligand, different from the first ligand, that is also bonded to the first central element M. Here, n denotes a number determined by the central element M and the ligand $L^a$, and m denotes a number determined by the central element M and the ligand $L^b$.

In some example embodiments, the ligand L, the first ligand $L^a$, and the second ligand $L^b$ may be appropriately adjusted according to the central element M such that the first source material SM1 has an appropriate boiling point. According to example embodiments, each of the ligand L, the first ligand $L^a$, and the second ligand $L^b$ may independently include halogen, such as fluoro (F—), chloro (Cl—), bromo (Br—), and iodo (I—), hydroxy (OH—), ammine ($NH_3$), C1-C10 amine, unsubstituted amido ($NH_2$—) or amido ($NH_2$—) substituted with a C1-C10 alkyl group, C1-C10 alkoxy, C1-C10 alkyl, C6-C12 aryl, C3-C15 allyl, C4-C15 diene, C5-C20 β-diketonato, C5-C20 β-ketoiminato, C5-C20 β-diiminato, or a combination thereof. For example, each of the ligand L, the first ligand $L^a$, and the second ligand $L^b$ may be independently dimethylamido (—$N(CH_3)_2$), ethyl methyl amido (—$NCH_3C_2H_5$), or diethylamido (—$N(C_2H_5)_2$). However, the inventive concepts are not limited thereto.

When the first source material SM1 is provided on the substrate 100, the first source material SM1 may be adsorbed on the substrate 100 in a self-limited manner. In some example embodiments, the first source material SM1 may be chemisorbed onto the surface of the substrate 100. Although not specifically shown in FIG. 3A, bonds at the surface of the substrate 100 may be terminated with a hydroxyl group (—OH), and the hydroxyl group may react with the ligand of the first source material SM1 to form a covalent bond.

When the central element M of the first source material SM1 is zirconium (Zr), the first source material SM1 may include, for example, at least of (cyclopentadienyl)tris(dimethylamino)zirconium ($CpZr(NMe_2)_3$), tetrakis-ethylmethylamido-zirconium (TEMAZ), tetrakis-diethylamido-zirconium (TDEAZ), tetrakis-dimethylamido-zirconium (TDMAZ), zirconium t-butoxide ($Zr(OtBu)_4$, abbreviated as ZTB), tetrakis(1-methoxy-2-methyl-2-propoxy) zirconium ($Zr(mmp)_4$), zirconium tetrachloride ($ZrCl_4$), $ZrCp_2Me_2$, $Zr(tBuCp)_2Me_2$, and $Zr(N(iProp)_2)_4$, but is not limited thereto.

When the central element M of the first source material SM1 is hafnium (Hf), the first source material SM1 may include, for example, at least one of (cyclopentadienyl)tris(dimethylamino)hafnium ($CpHf(NMe_2)_3$), hafnium t-butoxide ($Hf(OtBu)_4$, abbreviated as HTB), tetrakis(diethylamido)hafnium, ($Hf(NEt_2)_4$, abbreviated as TDEAH), tetrakis(ethylmethylamido)hafnium, ($Hf(NEtMe)_4$, abbreviated as TEMAH), and tetrakis(dimethylamido)hafnium (Hf($NMe_2)_4$, abbreviated as TDMAH), but is not limited thereto.

When the central element M of the first source material SM1 is yttrium (Y), the first source material SM1 may include, for example, at least one of $Y(N(SiMe_3)_2)_3$, $Y(N(i-Pr)_2)_3$, $Y(N(t-Bu)SiMe_3)_3$, $Y(TMPD)_3$, $Cp_3Y$, $(MeCp)_3Y$, and $Y(O(i-Pr))_3$, but is not limited thereto.

When the central element M of the first source material SM1 is lanthanum (La), the first source material SM1 may include, for example, at least one of $La(N(SiMe_3)_2)_3$, La(N(i-Pr)$_2$)$_3$, $La(N(t-Bu)SiMe_3)_3$, $La(TMPD)_3$, $((i-Pr)Cp)_3La$, $Cp_3La$, $Cp_3La(NCCH_3)_2$, $La(Me_2NC_2H_4Cp)_3$, $La(THD)_3$, and $La(O(i-Pr))_3$, but is not limited thereto.

When the central element M of the first source material SM1 is titanium (Ti), the first source material SM1 may include, for example, at least one of titanium tetrakis(isopropoxide) ($Ti(O-iProp)_4$), a titanium halide, cyclopentadienyl titanium, and titanium bis(isopropoxide)bis(2,2,6,6-tetramethyl-3,5-heptanedionate) ($Ti(O-iProp)_2(thd)_2$), but is not limited thereto.

When the central element M of the first source material SM1 is aluminum (Al), the first source material SM1 may include, for example, at least one of trimethyl aluminum (TMA), triethyl aluminum (TEA), 1-methylpyrrolidine alane (MPA), dimethylethylamine alane (DMEAA), and dimethyl aluminum hydride (DMAH), but is not limited thereto.

When the central element M of the first source material SM1 is germanium (Ge), the first source material SM1 may include, for example, at least one of germane ($GeH_4$), digermane ($Ge_2H_6$), trigermane ($Ge_3H_8$), $GeCl_4$, $Ge(Me)_4$, and $Ge(Et)_4$, but is not limited thereto.

When the central element M of the first source material SM1 is scandium (Sc), the first source material SM1 may include, for example, at least one of scandium chloride ($ScCl_3$), $Sc(N(i-Pr)_2)_3$, $Sc(N(t-Bu)SiMe_3)_3$, and $Cp_3Sc$, $Sc(O(i-Pr))_3$, but is not limited thereto.

When the central element M of the first source material SM1 is boron (B), the first source material SM1 may include, for example, at least one borane ($BH_3$), diborane ($B_2H_6$), trichloro-borane ($BCl_3$), tribromo-borane ($BBr_3$), and triiodoborane ($BI_3$), but is not limited thereto.

When the central element M of the first source material SM1 is silicon (Si), the first source material SM1 may include, for example, silane ($SiH_4$), disilane ($Si_2H_6$), monochlorosilane ($SiClH_3$), dichlorosilane ($SiCl_2H_2$), trichlorosilane ($SiCl_3H$), hexachlorodisilane ($Si_2Cl_6$), diethylsilane ($Et_2SiH_2$), tetraethyl orthosilicate ($Si(OCH_2CH_3)_4$, abbreviated as TEOS), or an alkyl aminosilane-based compound, but is not limited thereto. The alkylaminosilane-based compound may include, for example, diisopropylaminosilane($H_3Si(N(i-Pr)_2)$), bis(tertiary-butylamino)silane (($C_4H_9(H)N)_2SiH_2$), tetrakis(dimethylamino)silane(Si($NMe_2)_4$), tetrakis(ethylmethylamino)silane(Si($NEtMe)_4$), tetrakis(diethylamino)silane(Si($NEt_2)_4$), tris(dimethylamino)silane(HSi($NMe_2)_3$), tris(ethylmethylamino)silane (HSi($NEtMe)_3$), tris(diethylamino)silane(HSi($NEt_2)_3$), bis(diethylamino)silane($H_2Si(NEt_2)_2$), bis(diisopropylamino)silane($H_2Si(N(i-Pr)_2)_2$), tris(isopropylamino)silane(HSi(N(i-Pr)$_2$)$_3$), or (diisopropylamino)silane($H_3Si(N(i-Pr)_2)$), but is not limited thereto.

Here, Me denotes a methyl group, Et denotes an ethyl group, i-Pr denotes an isopropyl group, n-Pr denotes n-propyl group, Bu denotes a butyl group, n-Bu denotes an n-butyl group, Cp denotes a cyclopentadienyl group, THD denotes 2,2,6,6-tetramethyl-3,5-heptanedionate, TMPD denotes 2,2,6,6-tetramethyl-p-phenylenediamine, acac denotes acetylacetonate, hfac denotes hexafluoroacetylacetonate, and FOD denotes 6,6,7,7,8,8,8-heptafluoro-2,2-dimethyl-3,5-octanedionate.

Figure 3B:
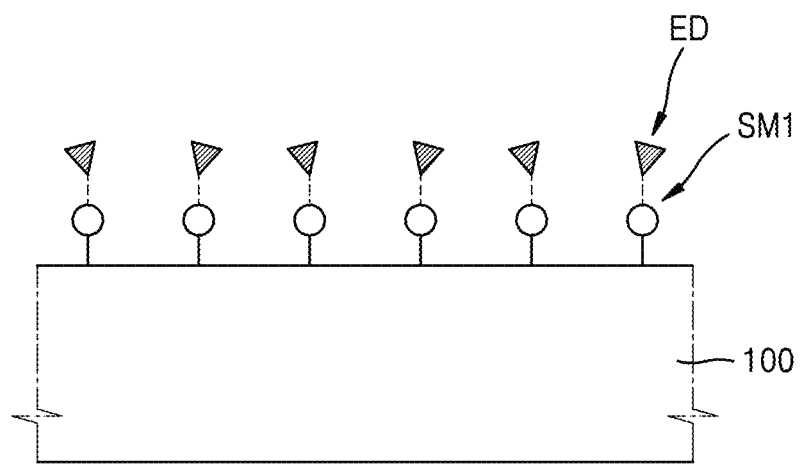

Referring to FIGS. 2 and 3B, an electron donor compound ED may be provided onto the substrate 100 (S22).

The electron donor compound ED may be a compound having an unshared electron pair or including a double bond or a triple bond. In some example embodiments, the electron donor compound ED may be an oxygen-containing, nitrogen-containing, sulfur-containing, or phosphorus-containing hydrocarbon compound having an unshared electron pair. In some example embodiments, the electron donor compound ED may include at least one of a C1-C10 alcohol compound, a C2-C10 ether compound, a C3-C10 ketone compound, a C6-C12 aryl compound, a C3-C15 allyl compound, a C4-C15 diene compound, a C5-C20 β-diketone compound, a C5-C20 β-ketoimine compound, a C5-C20 β-diimine compound, ammonia, a C1-C10 amine compound, a C1-C10 thiol compound, and a C2-C10 thioether compound.

The electron donor compound ED may be bonded to the first source material SM1. For example, the electron donor compound ED may be physisorbed on the first source material SM1. That is, the electron donor compound ED may provide an unshared electron pair or a shared electron pair to the first central element of the first source material SM1 and form a van der Waals bond. The van der Waals bond has weaker bonding force than a covalent bond, and may have a bonding energy of about 0.5 eV or less per adsorbed species. When the electron donor compound ED provides electrons to the central element, intermolecular attraction may occur between the first source material SM1 and the electron donor compound ED. The intermolecular attraction between the first source material SM1 and the electron donor compound ED may be weaker than the bonding force between the first central element and the ligand in the first source material SM1.

In FIGS. 3A to 3D, a solid line denotes a covalent bond or chemisorption, and a dashed line denotes a van der Waals bond or physisorption.

An excessive amount of the electron donor compound ED may be purged and/or removed, for example by supplying a non-reactive gas to the substrate 100. The excessive electron donor compound ED may include electron donor compound ED not bonded to the first source material SM1.

Figure 3C:
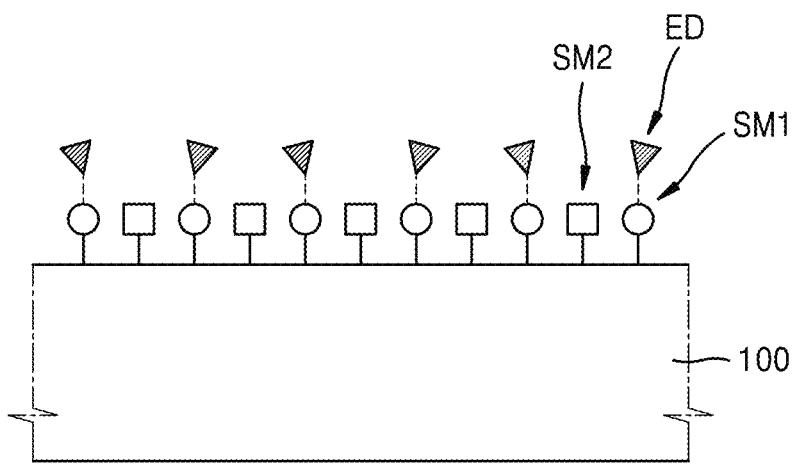

Referring to FIGS. 2 and 3C, a second source material SM2 may be provided on the substrate 100 (S23).

The second source material SM2 may be a material that is denoted by M'L$_n$. Here, M' denotes a second central element that is a central element of the second source material SM2, and L denotes a ligand bonded to M', which is the central element of the second source material SM2. Also, n denotes a number determined by the second central element M' and the ligand L and is, for example, an integer ranging from 2 to 6. Since the second central element M' is a metal or a semimetal as described above, additional descriptions thereof will be omitted.

In some example embodiments, the second source material SM2 may be a material that is denoted by M'(L$^a$)$_n$(L$^b$)$_m$. Here, L$^a$ denotes a first ligand bonded to the second central element M', and L$^b$ denotes a second ligand that is bonded to the second central element M' and different from the first ligand. Here, n denotes a number determined by the second central element M' and the ligand L$^a$, and m denotes a number determined by the second central element M' and the ligand L$^b$.

Since the ligand L, the first ligand L$^a$, and the second ligand L$^b$ have been described in detail in the description of the first source material SM1, additional descriptions thereof will be omitted. However, the ligand L, the first ligand L$^a$, and the second ligand L$^b$, which are bonded to the first source material SM1, may be independently different from the ligand L, the first ligand L$^a$, and the second ligand L$^b$, which are bonded to the second source material SM2.

The second source material SM2 may be chemisorbed on the substrate 100 and not form bonds with the first source material SM1. When the electron donor compound ED is not bonded to the first source material SM1, the first source material SM1 may react with the second source material SM2, which may produce reactions and compounds not intended for the deposition of an oxide film. The following chemical equations 1 and 2 show examples of unintended reactions of two source materials.

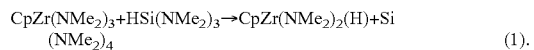

$$CpZr(NMe_2)_3 + HSi(NMe_2)_3 \rightarrow CpZr(NMe_2)_2(H) + Si(NMe_2)_4 \quad (1).$$

$$SiH_4 + 4BCl_3 \rightarrow 3SiCl_4 + 4BH_3 \quad (2).$$

CpZr(NMe$_2$)$_2$(H) generated by reacting source materials in chemical equation 1 and BH$_3$ generated in chemical equation 2 may have poor thermal stability, and Si(NMe$_2$)$_4$ may be generated in a solid state and form particles. Accordingly, these unwanted reaction products may become an obstruction to the formation of an oxide film with a desired thickness at a desired position.

However, the electron donor compound ED may bond to the first source material SM1 and prevent the first source material SM1 from reacting with the second source material SM2 and thus, the uniformity of a deposited oxide film may be improved.

When the second source material SM2 is provided on the substrate 100, the second source material SM2 may be adsorbed on the substrate 100 in a self-limited manner. In some example embodiments, the second source material SM2 may be chemisorbed on the surface of the substrate 100. Although not specifically shown in FIG. 3C, in some example embodiments, the surface of the substrate 100 may be terminated with a hydroxyl group (—OH), and the hydroxyl group may react with the ligand of the second source material SM2 to form a covalent bond.

Figure 3D:
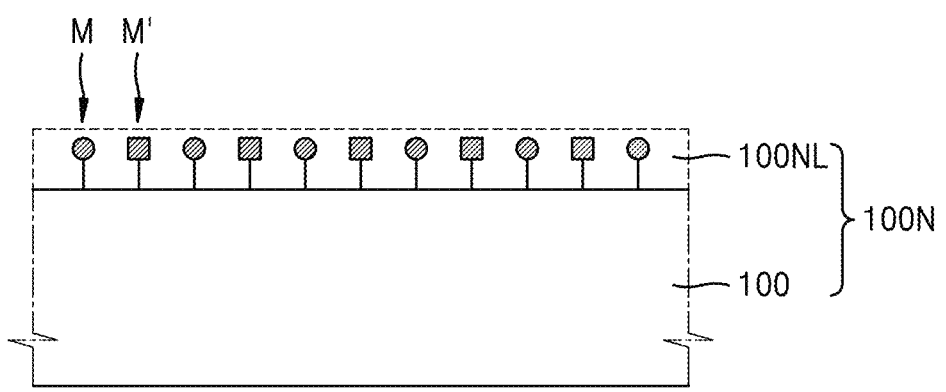

Referring to FIGS. 2 and 3D, an oxidant may be provided on the substrate 100 (S24).

In some example embodiments, the oxidant may include at least one of H$_2$O, O$_2$, O$_3$, N$_2$O, NO, NO$_2$, N$_2$O$_4$, H$_2$O$_2$, C1-C10 alcohol, C2-C10 ether, C3-C10 ketone, C1-C10 carboxylic acid, and C1-C10 ester.

The electron donor compound ED may include carbon and hydrogen as main constituent elements. When the oxidant is provided on the substrate 100, the carbon in the electron donor compound ED may react with the oxidant, for example bond to an oxygen, and the oxidized electron donor compound may be more easily removed. Also, since the ligands of the first source material SM1 and the second source material SM2 also include carbon and hydrogen as main constituent elements, the ligands may also react with the oxidant and be more easily removed.

The first central element M and the second central element M' may react together with the oxygen (oxygen is not shown in FIG. 3D) and form an oxide film 100NL on the substrate 100. It may be determined whether the oxide film 100NL has been formed to a desired thickness (refer to S3 in FIG. 1). When a thickness of the oxide film 100NL is less than the desired thickness, the above-described cycle may be repeated. Furthermore, the oxide film 100NL, which is a layer of the first central element M and the second central element M', may act as a substrate 100N for the next cycle.

Figure 4:
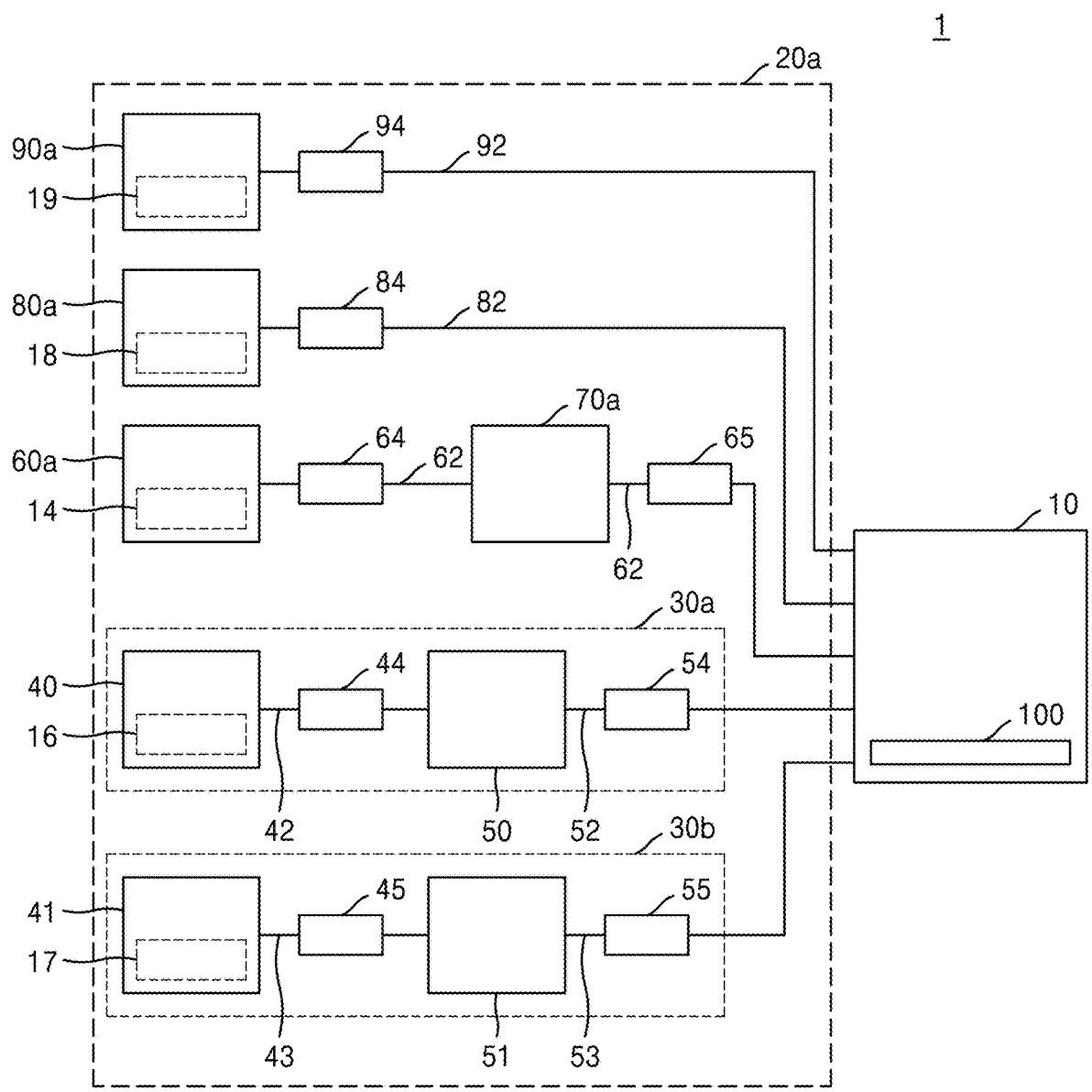
FIG. 4 is a schematic diagram of a semiconductor apparatus configured to perform a method of forming a material film according to an example embodiment.

FIG. 4 is a schematic diagram of a semiconductor apparatus 1 configured to perform a method of forming a material film according to an example embodiment.

Referring to FIG. 4, the semiconductor processing apparatus 1 may include a process material supply system 20a capable of independently supplying an electron donor compound 14, a first source material 16, a second source material 17, a purge gas 19, and an oxidant 18 into a reaction chamber 10. The process material supply system 20a may be configured to independently supply the electron donor compound 14, the first source material 16, the second source material 17, the purge gas 19, and the oxidant 18 into the reaction chamber 10 for different time periods. Alternatively, the process material supply system 20a may be configured to supply at least two of the electron donor compound 14, the first source material 16, the second source material 17, the purge gas 19, and the oxidant 18 into the reaction chamber 10 at the same time. The reaction chamber 10 may be a chamber into and from which a substrate 100 may be loaded and unloaded.

The semiconductor processing apparatus 1 may be controlled by a controller (not shown). The controller may comprise memory functionally connected to a processor. The processor may include processing circuitry such hardware including logic circuits; a hardware/software combination such as a processor executing software; or a combination thereof. For example, the processing circuity more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The process material supply system 20a may include a first source material supply apparatus 30a, a second source material supply apparatus 30b, an electron donor compound supply apparatus 60a, a purge gas supply apparatus 90a, and an oxidant supply apparatus 80a. The first source material supply apparatus 30a may be an apparatus configured to supply the first source material 16 into the reaction chamber 10. The second source material supply apparatus 30b may be an apparatus configured to supply the second source material 17 into the reaction chamber 10.

The first and second source material supply apparatuses 30a and 30b may include source material storage containers 40 and 41 and vaporizers 50 and 51. The source material storage containers 40 and 41 may be connected to the vaporizers 50 and 51 by conduits 42 and 43, respectively. The conduits 42 and 43 may include flow rate control devices 44 and 45, respectively. The vaporizers 50 and 51 may be connected to the reaction chamber 10 by conduits 52 and 53, respectively, and the conduits 52 and 53 may include flow rate control devices 54 and 55, respectively. The vaporizers 50 and 51 may be, for example, atomizers The first and second source materials 16 and 17 in the first and second source material storage containers 40 and 41 may be transported to the vaporizers 50 and 51 and vaporized in the vaporizers 50 and 51, respectively. For example, the vaporizers 50 and 51 may vaporize the first and second source materials 16 and 17 using pressure, (e.g., an atomizers) or through heat. The first and second source materials 16 and 17 vaporized by the vaporizers 50 and 51 may be supplied to the reaction chamber 10.

The electron donor compound supply apparatus 60a may be an apparatus configured to supply the electron donor compound 14 into the reaction chamber 10. The electron donor compound 14 may be stored in the electron donor compound supply apparatus 60a and supplied from the electron donor compound supply apparatus 60a into the reaction chamber 10 through a conduit 62.

The electron donor compound supply apparatus 60a may be connected to the reaction chamber 10 by the conduit 62, and the conduit 62 may include a flow rate control device 64 capable of controlling a flow rate of the electron donor compound 14.

The oxidant supply apparatus 80a may be an apparatus configured to supply the oxidant 18 into the reaction chamber 10. The oxidant 18 may be stored in the oxidant supply apparatus 80a and supplied from the oxidant supply apparatus 80a into the reaction chamber 10 through a conduit 82. The oxidant supply apparatus 80a may be connected to the reaction chamber 10 by the conduit 82, and the conduit 82 may include a flow rate control device 84 capable of controlling a flow rate of the oxidant 18. Though not illustrated, when the oxidant 18 is not supplied as a gas, a vaporizer may be used to vaporize the oxidant 18, and the vaporized oxidant 18 may be supplied to the reaction chamber 10, or the nongaseous oxidant 18 may be applied to the reaction chamber 10 as, for example, a liquid.

The purge gas supply apparatus 90a may be an apparatus configured to supply the purge gas 19 into the reaction chamber 10. The purge gas 19 may be stored in the purge gas supply apparatus 90a and supplied from the purge gas supply apparatus 90a into the reaction chamber 10 through a conduit 92. The purge gas supply apparatus 90a may be connected to the reaction chamber 10 by the conduit 92, and the conduit 92 may include a flow rate control device 94 capable of controlling a flow rate of the purge gas 19.

The conduits 42, 52, 62, 82, and 92 may be conduits through which fluids may flow, and the flow rate control devices 44, 54, 64, 84, and 94 may include valve systems capable of controlling the flows of the respective fluids and gases.

The process material supply system 20a may be a system capable of independently supplying the electron donor compound 14, the first source material 16, the second source material 17, the purge gas 19, and the oxidant 18 into the reaction chamber 10. The process material supply system 20a may be configured to supply the electron donor compound 14, the first source material 16, the second source material 17, the purge gas 19, and the oxidant 18 into the reaction chamber 10 at different times and for different time periods or at the same times.

By using the method according to the example embodiments, a high-aspect-ratio material film including at least two materials may be formed to have uniformity in terms of composition and dimensions.

Referring to FIG. 4, the electron donor compound supply apparatus 60a may be an apparatus configured to supply the electron donor compound 14 into the reaction chamber 10. The electron donor compound supply apparatus 60a may include a canister configured to supply the electron donor compound 14. The canister may be configured to uniformly supply the electron donor compound 14.

The electron donor compound supply apparatus 60a may supply the electron donor compound 14 in a liquid state into the flow rate control device 64. A flow rate of the electron donor compound 14 may be constantly controlled by the flow rate control device 64, and then the electron donor compound 14 may be vaporized by a vaporizer 70a. Accordingly, the amount of the electron donor compound 14 supplied into the reaction chamber 10 may be uniformly controlled.

Each of the electron donor compound 14, the first source material 16, the second source material 17, and the oxidant 18 may be transported using a carrier gas. The carrier gas may be an inert gas, such as argon (Ar), helium (He), nitrogen (N), or neon (Ne), but is not limited thereto. A flow rate of the carrier gas may be selected based on factors, such as a deposition rate of an oxide film, a vapor pressure of a material to be transported, and a temperature. For example, the flow rate of the carrier gas may range from about 200 standard cubic centimeters per minute (sccm) to about 1300 sccm.

FIGS. 5A to 5F are timing diagrams illustrating configurations of supply cycles of a first source material SM1, a second source material SM2, an electron donor compound ED, and an oxidant according to example embodiments. In FIGS. 5A to 5F, each of feed materials may be pulse-supplied. Flow rates and feeding times of the respective feed materials may not be proportional to heights and widths of pulses shown in FIGS. 5A to 5F. Although not specifically shown in FIGS. 5A to 5F, purge gases for a purging process may be supplied between pulses of the respective feed materials to remove reaction products and/or excessive amounts of feed materials from the reaction chamber.

Figure 5A:
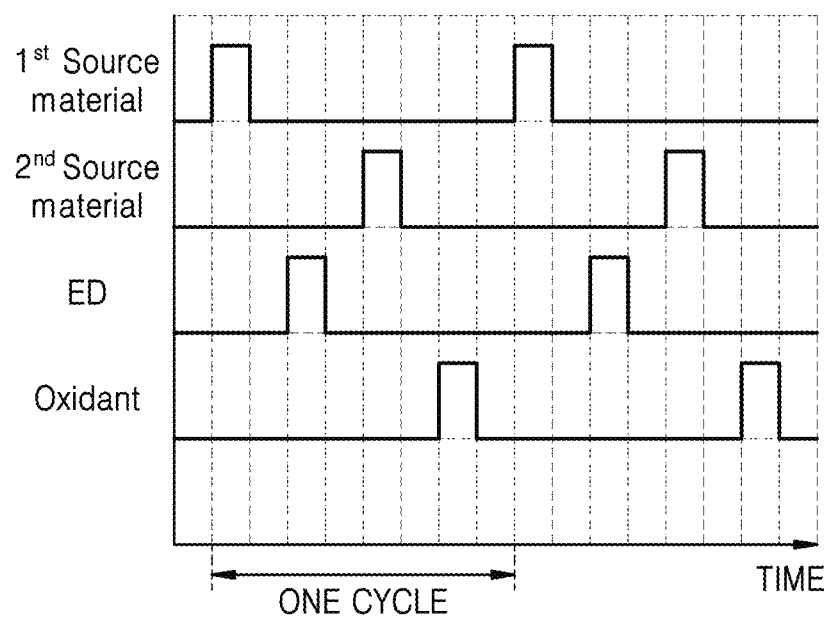
FIGS. 5A to 5F are timing diagrams illustrating configurations of supply cycles of a first source material, a second source material, an electron donor compound, and an oxidant according to example embodiments.

Referring to FIG. 5A, after the first source material SM1 is supplied onto a substrate 100, the electron donor compound ED may be supplied, and the second source material SM2 may be subsequently supplied.

When the first source material SM1 is initially supplied, the first source material SM1 may be chemisorbed on the surface of the substrate 100, and the first source material SM1 may be formed on the level of one monolayer or less due to a purging process.

Thereafter, when the electron donor compound ED is supplied, the electron donor compound ED may be physisorbed on the first source material SM1. As described above, the electron donor compound ED may form a van der Waals bond while providing an unshared electron pair or a shared electron pair to the first source material SM1.

Thereafter, an excessive amount of electron donor compound ED may be purged and removed, for example, with the purge gas 19.

Subsequently, the second source material SM2 may be supplied onto the substrate 100. The second source material SM2 may be chemisorbed on the substrate 100 without reacting with the first source material SM1. As described above, since the first source material SM1 is bonded to the electron donor compound ED, the first source material SM1 may be prevented from reacting with the second source material SM2. Accordingly, non-uniform film growth and particle generation due to the reaction of the first source material SM1 with the second source material SM2 may be minimized, inhibited, or prevented.

Thereafter, when the oxidant is supplied into the reaction chamber, the oxidant may react with a first central element M and a second central element M' to form an oxide film having a composition of approximately $M_xM'_yO_z$. The electron donor compound ED may be removed from the surface of the substrate 100 due to a reaction with the oxidant.

When the reaction chamber is purged with a purge gas, excessive amounts of oxidant and reaction byproducts may be removed from the reaction chamber.

Figure 5B:
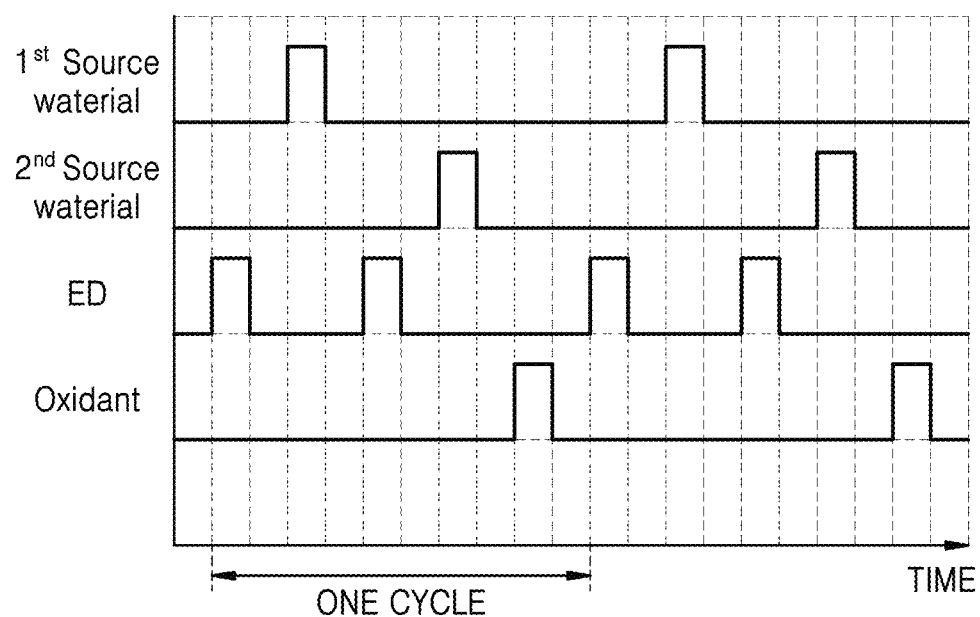

Referring to FIG. 5B, the supply cycle is substantially the same as the supply cycle shown in FIG. 5A except that the electron donor compound ED is supplied before a first source material SM1 is supplied on a substrate 100. Accordingly, differences between the supply cycles shown in FIGS. 5A and 5B will mainly be described, and repeated descriptions will be omitted.

When the electron donor compound ED is supplied onto the substrate 100, the electron donor compound ED may be physisorbed on the surface of the substrate 100 to form a monolayer. The monolayer of the electron donor compound ED may have an effect of preventing and delaying the chemisorption of a subsequent first source material SM1.

When a surface of a feature (i.e., the substrate 100) on which an oxide film is to be formed has a high aspect ratio, the chemisorption of the first source material SM1 may unevenly occur from an upstream side of mass transfer to a downstream side of the mass transfer. Here, the term "upstream" refers to an upstream side of the flow of a material to be deposited, and the term "downstream" refers to a downstream side of the flow of the material to be deposited. However, in the present example embodiment, the chemisorption of the first source material SM1 on the surface of the feature (i.e., the surface of the substrate 100) may be slowed due to the electron donor compound ED that is previously physisorbed. Thus, the first source material SM1 may be further diffused to the downstream side, and the overall uniformity of the first source material SM1 may be improved.

Figure 5C:
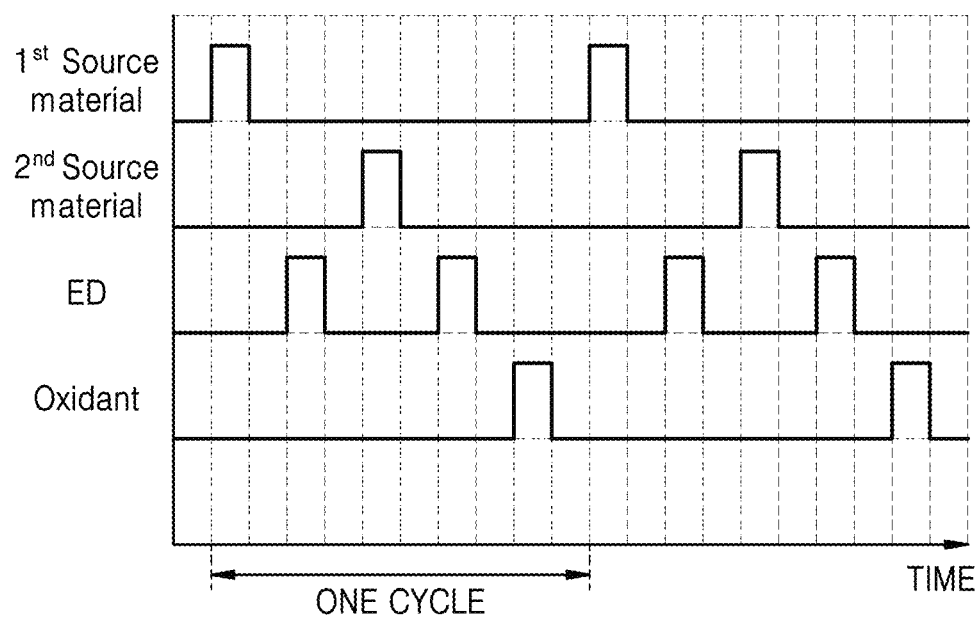

Referring to FIG. 5C, the supply cycle is substantially the same as the supply cycle shown in FIG. 5A except that the supply cycle further includes supplying the electron donor compound ED after the second source material SM2 is provided on the substrate 100 and before the oxidant is provided. Accordingly, differences between the supply cycles shown in FIGS. 5A and 5C will mainly be described, and repeated descriptions will be omitted.

When the first source material SM1 and the electron donor compound ED are sequentially supplied into the reaction chamber, the first source material SM1 may be chemisorbed on the substrate 100, and the electron donor compound ED may be physisorbed thereon. Here, when the second source material SM2 is supplied into the reaction chamber, the second source material SM2 may be chemisorbed on the substrate 100, and an excessive amount of the second source material SM2 may be additionally physisorbed thereon. The second source material SM2 physisorbed as described above may be partially removed using a purging process, but part of the second source material SM2 may still remain. The physisorbed second source material SM2, which is excessively adsorbed, may need to be removed to form a uniform oxide film.

Subsequently, when the electron donor compound ED is supplied, the electron donor compound ED may be van der Waals-bonded to the second source material SM2. For example, when the electron donor compound is an ether-based material, an unshared electron pair of an oxygen atom contained in an ether group may be bonded to a central atom of the second source material SM2 that is excessively adsorbed. The second source material SM2 that is physisorbed on another second source material SM2 may be released due to the combination, and the excessively adsorbed second source material SM2 may be mostly removed. When the reaction chamber is subsequently purged with the purge gas again, the excessive electron donor compound ED and the reaction byproducts may be removed from the reaction chamber, and a layer at which the second source material SM2 is chemisorbed on the level of one monolayer or less may be obtained on the substrate 100.

Thereafter, when the oxidant is supplied, the oxidant may form an oxide film as described with reference to FIG. 5A. Subsequently, the reaction chamber may be purged with a purge gas and thus, excessive amounts of oxidant and reaction byproducts may be removed from the reaction chamber.

Figure 5D:
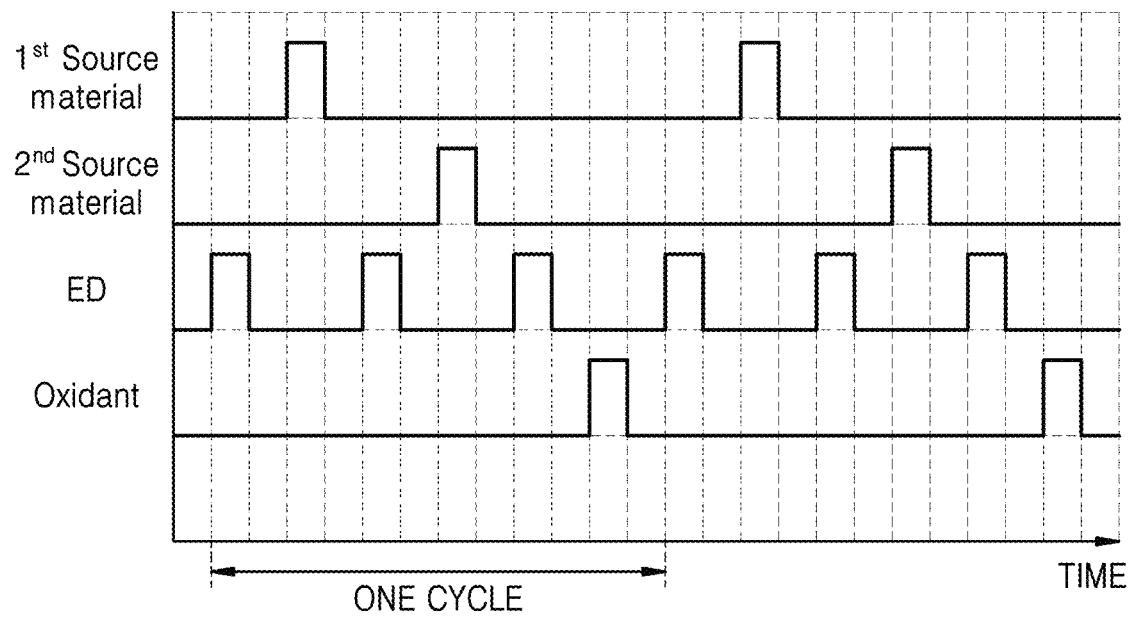

Referring to FIG. 5D, the supply cycle may be substantially the same as the supply cycle shown in FIG. 5C except that the electron donor compound ED is supplied before the first source material SM1 is supplied onto the substrate 100. Accordingly, differences between the supply cycles shown in FIGS. 5C and 5D will mainly be described, and repeated descriptions will be omitted.

However, the supply cycle shown in FIG. 5D may be similar to the supply cycle shown in FIG. 5B in that the electron donor compound ED is supplied before the first source material SM1 is supplied onto the substrate 100 and thus, the supply cycle shown in FIG. 5D may have similar effects to the supply cycle shown in FIG. 5B. Specifically, the monolayer of the electron donor compound ED may have an effect of inhibiting and delaying subsequent chemisorption of the first source material SM1, and the first source material SM1 may be further diffused to the downstream side over the surface of the feature (i.e., the surface of the substrate 100) on which the oxide film is to be formed. Accordingly, the uniformity of the first source material SM1 may be improved on the surface of the feature on which the oxide film is to be formed.

Furthermore, since the electron donor compound ED is supplied after the second source material SM2 is supplied and before an oxidant is supplied, the second source material SM2 that is excessively adsorbed may be mostly removed, and a layer of the second source material SM2, which is chemisorbed on the level of one monolayer, may be obtained on the substrate 100.

In conclusion, an oxide having extremely excellent or substantially uniform step coverage may be formed on the surface of the feature (e.g., the surface of the substrate 100).

Figure 5E:
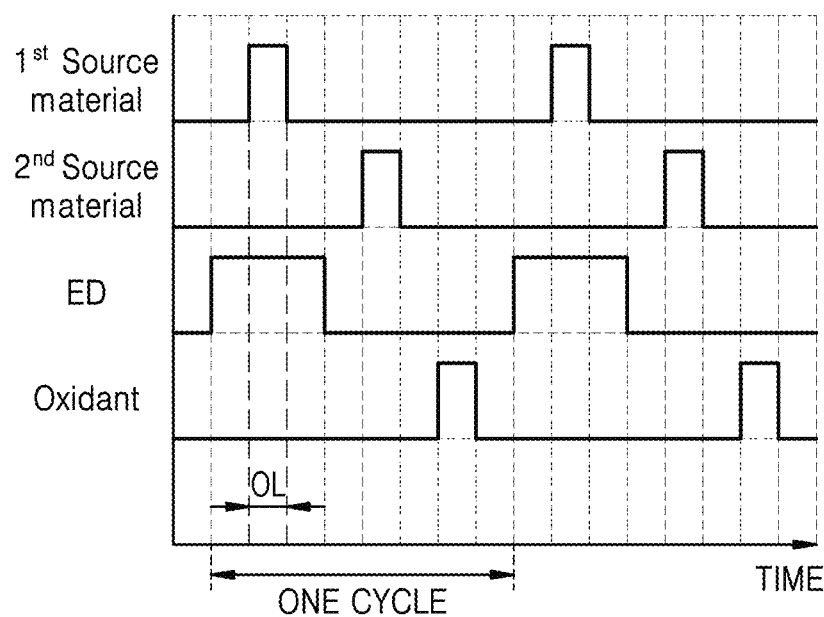

Referring to FIG. 5E, a time period for which the electron donor compound ED is supplied may overlap with a time period for which the first source material SM1 is supplied for a predetermined time OL. Specifically, a point in time when the supplying of the electron donor compound ED starts may be earlier than a point in time when the supplying of the first source material SM1 starts. Also, a point in time when the supplying of the electron donor compound ED ends may be later than a point in time when the supplying of the first source material SM1 ends. That is, the time period for which the first source material SM1 may be nested in the time period for which the electron donor compound ED is supplied.

When the supply cycle is configured as shown in FIG. 5E, similar effects to those of the example embodiment shown in FIG. 5B may be obtained. However, a purge time between a first pulse of the electron donor compound ED and a pulse of the first source material SM1 and a purge time between the pulse of the first source material SM1 and a second pulse of the electron donor compound ED, which are shown in the example embodiment of FIG. 5B, may be reduced and thus, an oxide film may be formed rapidly.

In some cases, the first source material SM1 may be bonded to each other to form a dimer or a trimer. When the dimer or the trimer is adsorbed on the surface of the substrate 100, the first source material SM1 may be adsorbed in at least two layers to cause excessive adsorption. In this case, when a time period for which the first source material SM1 is supplied overlaps a time period for which the electron donor compound ED is supplied, a probability that the first source material SM1 will form the dimer or the trimer may be reduced, thus alleviating a problem of excessive adsorption.

Figure 5F:
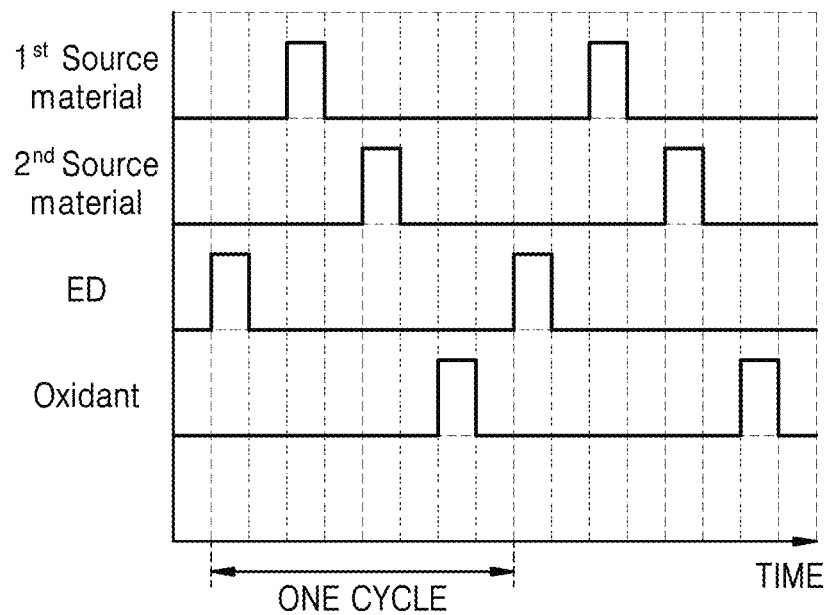

Referring to FIG. 5F, a supply cycle may be configured such that the supplying of the electron donor compound ED into the reaction chamber precedes the supplying of the first source material SM1 into the reaction chamber.

In this case, the electron donor compound ED may be adsorbed on the surface of the feature and have effects of stabilizing the surface of the feature, and inhibiting and delaying subsequent chemisorption of the first source material SM1. The first source material SM1 may be further diffused to the downstream side over the surface of the feature (i.e., the surface of the substrate 100) on which the oxide film is to be formed. Accordingly, the uniformity of the first source material SM1 may be improved on the surface of the feature on which the oxide film is to be formed. Since the electron donor compound ED is adsorbed on the surface of the feature, the electron donor compound ED may also inhibit the chemisorption of the second source material SM2.

Thereafter, when an oxidant is supplied, the oxidant may form an oxide film as described with reference to FIG. 5A. When the reaction chamber is then purged with a purge gas, excessive amounts of oxidant and reaction byproducts may be removed from the reaction chamber.

The embodiments described with reference to FIGS. 5A to 5F are example embodiments, and it is obvious that not only combinations of the embodiments of FIGS. 5A to 5F but also supply cycles, which may be easily implemented by one skilled in the art based on the embodiments of FIGS. 5A to 5F, fall within the scope of the inventive concept.

FIGS. 6A to 6H are side cross-sectional views of a process sequence of a method of manufacturing a semiconductor device according to an example embodiment.

Figure 6A:
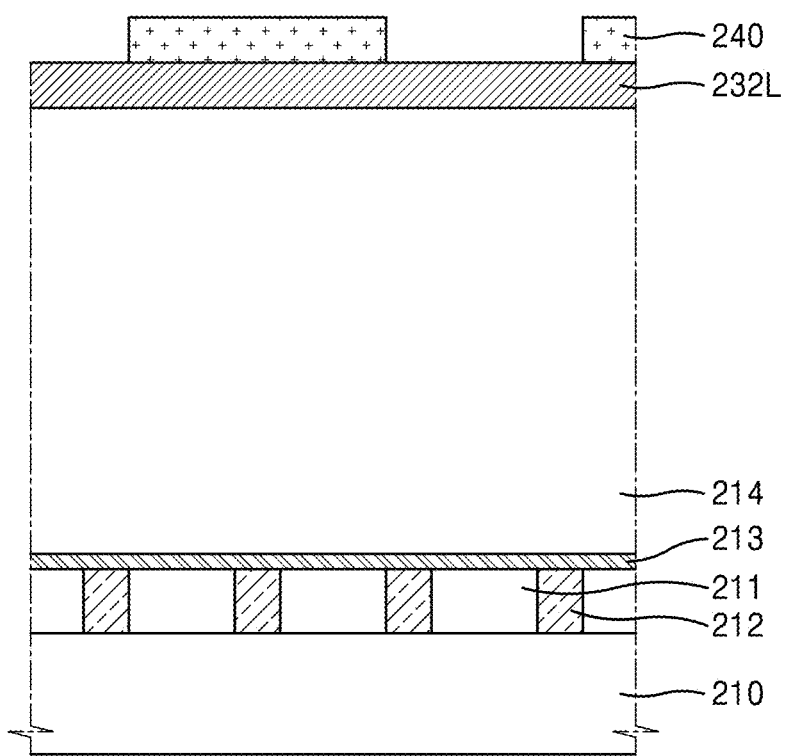
FIGS. 6A to 6H are side cross-sectional views of a process sequence of a method of manufacturing a semiconductor device according to an example embodiment.

Referring to FIG. 6A, an interlayer insulating film 211, contact plugs 212, and an etch stop film 213 may be formed on a substrate 210, and a first mold film 214 for forming a capacitor may be formed thereon. A support layer 232L may be formed on the first mold film 214. In some example embodiments, the support layer 232L may have a thickness of about 10 nm to about 500 nm. A mask pattern 240 for patterning a support layer may be formed on the support layer 232L. The mask pattern 240 may be formed to have a pattern corresponding to a support pattern to be subsequently formed. The mask pattern 240 may be, for example, a photoresist pattern.

The substrate 210 may be a semiconductor substrate, for example a silicon substrate, a germanium substrate, or a silicon-germanium substrate. However, the substrate 210 is not limited thereto and may be any one of the substrates described above with reference to FIGS. 1 and 2.

The interlayer insulating film 211 may include a dielectric material. For example, the interlayer insulating film 211 may include an oxide, a nitride, and/or an oxynitride. The interlayer insulating film 211 may include a single layer or include at least two layers.

The contact plugs 212 may be formed on the substrate 210 and pass through the interlayer insulating film 211. The contact plugs 212 may include at least one of a semiconductor material such as doped polysilicon (poly-Si); a metal such as tungsten (W), titanium (Ti), tantalum (Ta), copper (Cu), and aluminum (Al); a metal nitride such as tungsten nitride (WN), titanium nitride (TiN), and tantalum nitride (TaN); a metal silicon nitride such as titanium silicon nitride (TiSiN) and tungsten silicon nitride (WSiN); and a metal silicide such as tungsten silicide (WSi).

Although not shown in the drawings, a plurality of word lines and a plurality of bit lines may be formed on the substrate 210, intersect each other, and be covered by the interlayer insulating film 211. Doping regions may be located in the substrate 210 on both sides of each of the word lines, and each of the contact plugs 212 may be connected to one doping region. Also, the contact plugs 212 may be electrically connected to a switching element corresponding thereto. The switching element may be an active element, such as a transistor or a diode.

The first mold film 214 may be formed on the etch stop film 213. The first mold film 214 may include at least one of an oxide film, a nitride film, and an oxynitride film.

Although not shown, a buffer film (not shown) may be further formed between the first mold film 214 and the etch stop film 213. The buffer film may include at least one of an oxide film and a nitride film.

The support layer 232L may include a material having an etch selectivity with respect to the first mold film 214. For example, when the first mold film 214 is partially or completely removed using a low ammonium fluoride liquid (LAL) lift-off process, the support layer 232L may include a dielectric material having a relatively low etch rate with respect to LAL.

When the first mold film 214 includes at least one of $SiO_2$, SiGe, Si, and a carbon-based material, the support layer 232L may be formed using any one selected out of SiN, SiCN, TaO, and $TiO_2$. However, the inventive concepts are not limited to these materials.

Figure 6B:
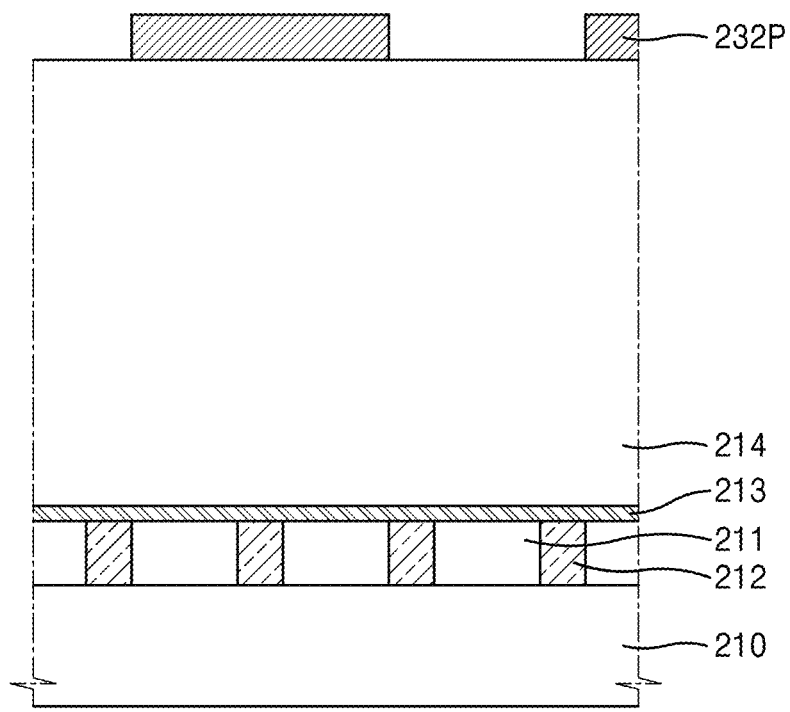

Referring to FIG. 6B, an exposed portion of the support layer 232L may be anisotropically etched using the mask pattern 240 as an etch mask, thereby forming a support layer pattern 232P. Due to the anisotropic etching process, a portion of the first mold film 214 may be exposed between the support layer patterns 232P.

Figure 6C:
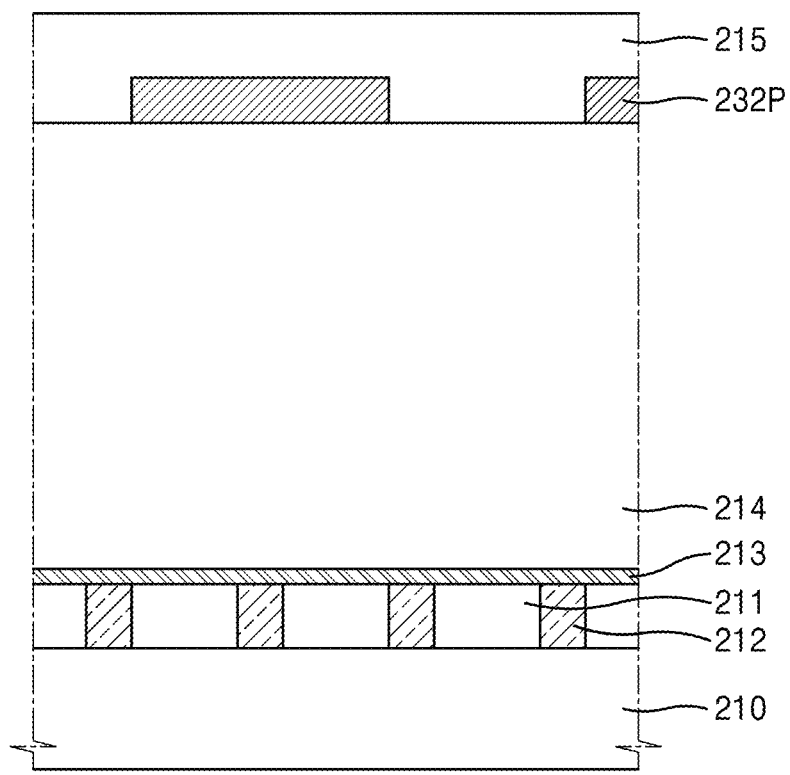

Referring to FIG. 6C, a second mold film 215 may be formed on the first mold film 214 and the support layer pattern 232P. The second mold film 215 may include the same material as the first mold film 214 or a material having a similar etch rate to that of the first mold film 214. For example, when the first mold film 214 and the second mold film 215 are removed using an LAL lift-off process, the second mold film 215 may include a material of which an etch rate with respect to LAL is 10% or less, different from an etch rate of the first mold film 214 with respect to LAL. The second mold film 215 may be formed to such a thickness as to completely cover the support layer pattern 232P. For example, the second mold film 215 may be formed to a thickness of at least 50 nm. Also, the sum of thicknesses of the first mold film 214 and the second mold film 215 may range from about 2000 Å to about 8000 Å.

Figure 6D:
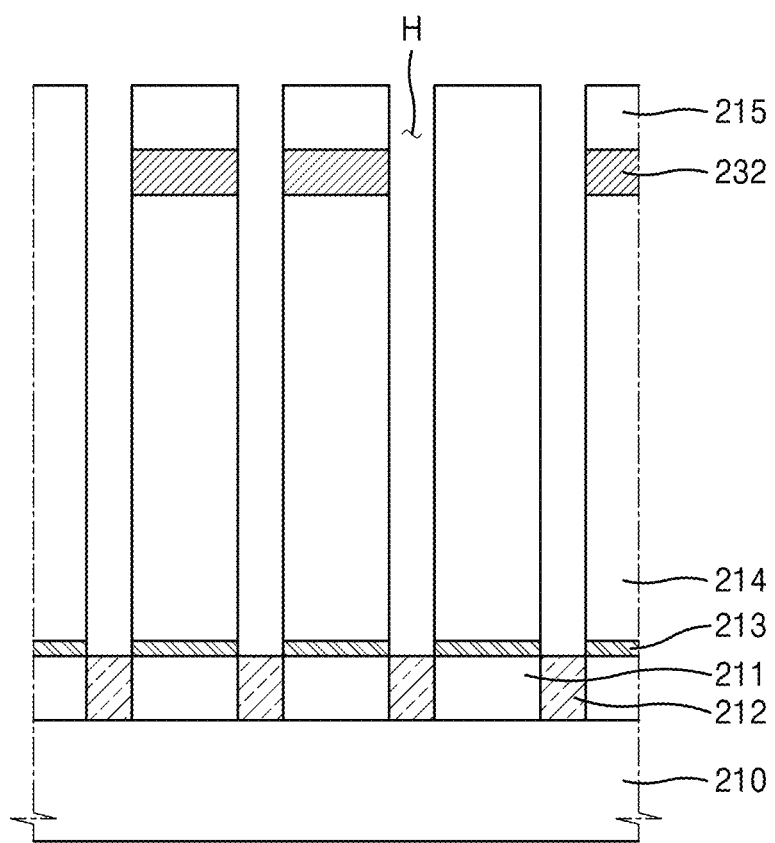

Referring to FIG. 6D, the second mold film 215, the support pattern 232, the first mold film 214, and the etch stop film 213 may be etched so that the contact plugs 212 are exposed at positions where cylindrical lower electrodes will be formed, thereby forming a plurality of openings H. One opening H may be connected to at least one of the other openings H by the support pattern 232. However, the opening H may not be necessarily connected to at least one of the other openings H.

The opening H may expose an upper surface of the contact plug 212. The formation of the opening H may include forming a mask pattern for defining the opening H on the second mold film 215 and etching the first mold film 214, the second mold film 215, and the support pattern 232 using the mask pattern as an etch mask. According to an example embodiment, the opening H may be formed in a hole shape.

Figure 6E:
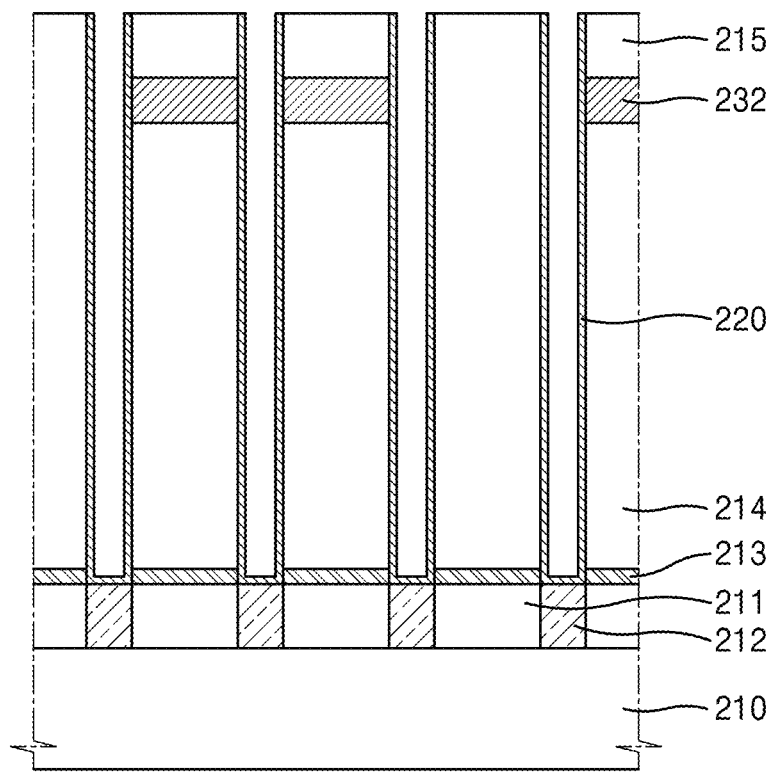

Referring to FIG. 6E, a conductive material may be deposited on the entire surface of the structure formed on the substrate 210. That is, for example, the conductive material may be deposited on an inner wall of the opening H and the second mold film 215, and the conductive material deposited on the inner wall of the opening H may be separated to form a plurality of lower electrodes 220. The formation of the lower electrodes 220 may include conformally forming the conductive material, forming a burying layer (not shown) on the entire surface of the resultant structure formed on the substrate 110 to fill the opening H, and performing a planarization process for removing the filling layer and the conductive material by using an etchback process and/or a chemical mechanical polishing (CMP) process so that the second mold film 215 is exposed. The lower electrode 220 may be electrically connected to the contact plug 212. According to an example embodiment, the lower electrode 220 may include a plate portion in contact with the contact plug 212 and a sidewall portion that extends in a vertical direction from an edge of the plate portion. Accordingly, the lower electrode 220 may have an empty space defined by the plate portion and the sidewall portion. For example, the lower electrode 220 may be of a cylindrical type.

The lower electrode 220 may include, for example, a semiconductor material such as doped poly-Si; a metal such as ruthenium (Ru), iridium (Ir), titanium (Ti), and/or tantalum (Ta); a conductive metal nitride such as titanium nitride (TiN), tantalum nitride (TaN), and tungsten nitride (WN); a conductive metal oxide such as iridium oxide (IrO); and/or a composite material thereof. The lower electrode 220 may include a single layer or a multilayered structure.

The conductive material on the second mold film 215 may be removed using a CMP process, and the filling layer may be removed using an etchback process. The filling layer may include the same material as the first mold film 214 and/or the second mold film 215 or a material having an etch rate similar to that of the first mold film 214 and/or the second mold film 215. The filling layer may be, for example, an oxide film.

Although an example in which the lower electrode 220 is a cylindrical type (i.e., a one cylinder storage (OCS) type), it will be understood by one skilled in the art that the following processes may be also applied to a pillar-type lower electrode or a concave lower electrode.

Figure 6F:
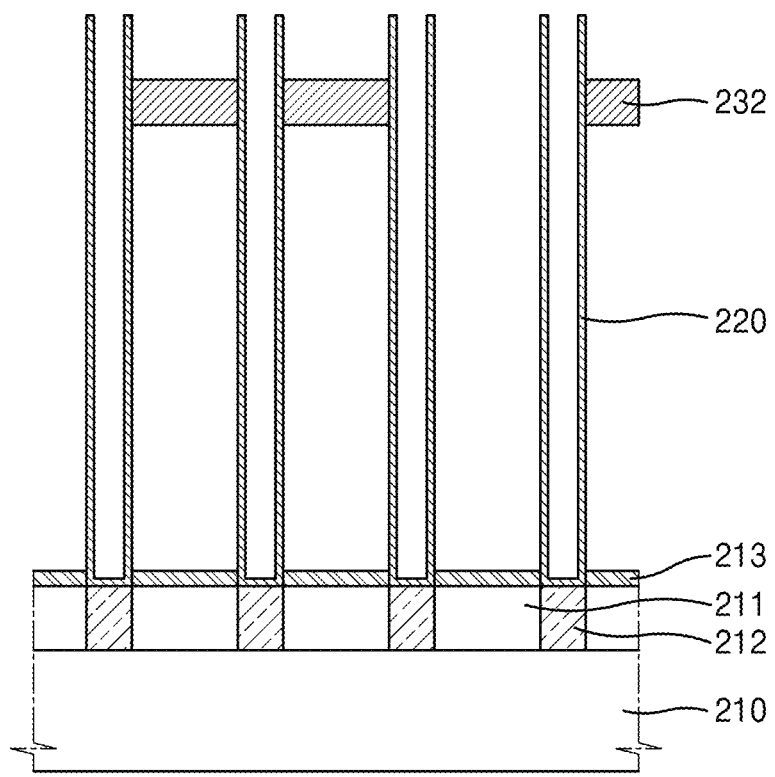

Referring to FIG. 6F, after the lower electrode 220 is formed, the first mold film 214 and the second mold film 215 may be removed. Also, the filling layer may be removed together with or separately from the first mold film 214 and the second mold film 215. For instance, the first mold film 214, the second mold film 215, and the filling layer may be removed by a lift-off process using LAL including ammonium fluoride ($NH_4F$), hydrofluoric acid (HF), and water, or may be removed by using HF. Accordingly, as described above, a material of the support layer pattern 232P may be selected to have a lower etch rate with respect to LAL than the first mold film 214 and the second mold film 215. At least portions of the lower electrodes 220 may be supported by a support pattern 232. In FIG. 6F, the support pattern 232 may be formed at a lower level than an end portion of a cylindrical structure (i.e., the lower electrode 220 of a cylindrical type). In some example embodiments, the support pattern 232 may be formed at the same level as the end portion of the lower electrode 220.

Figure 6G:
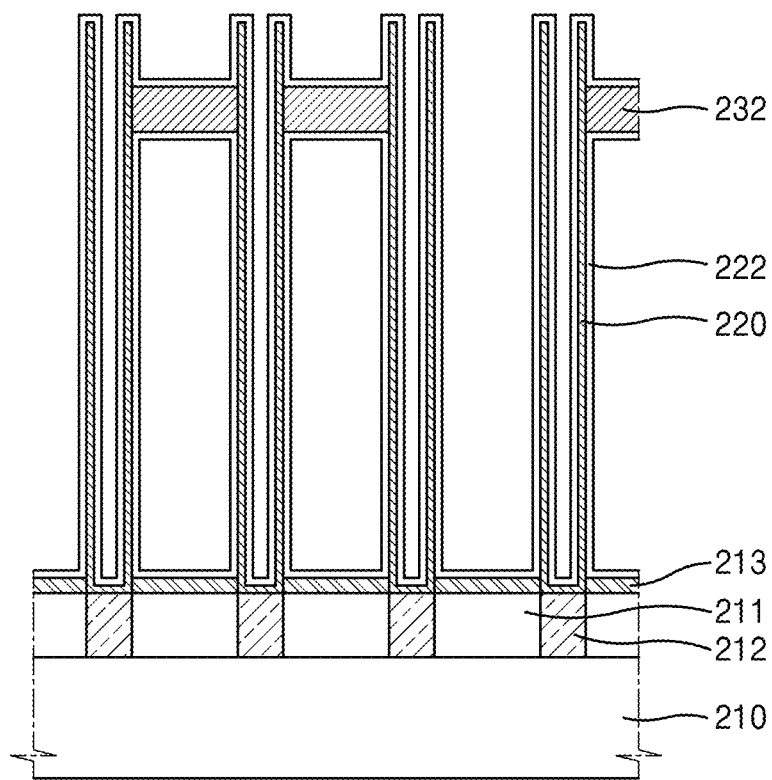
Figure 7:
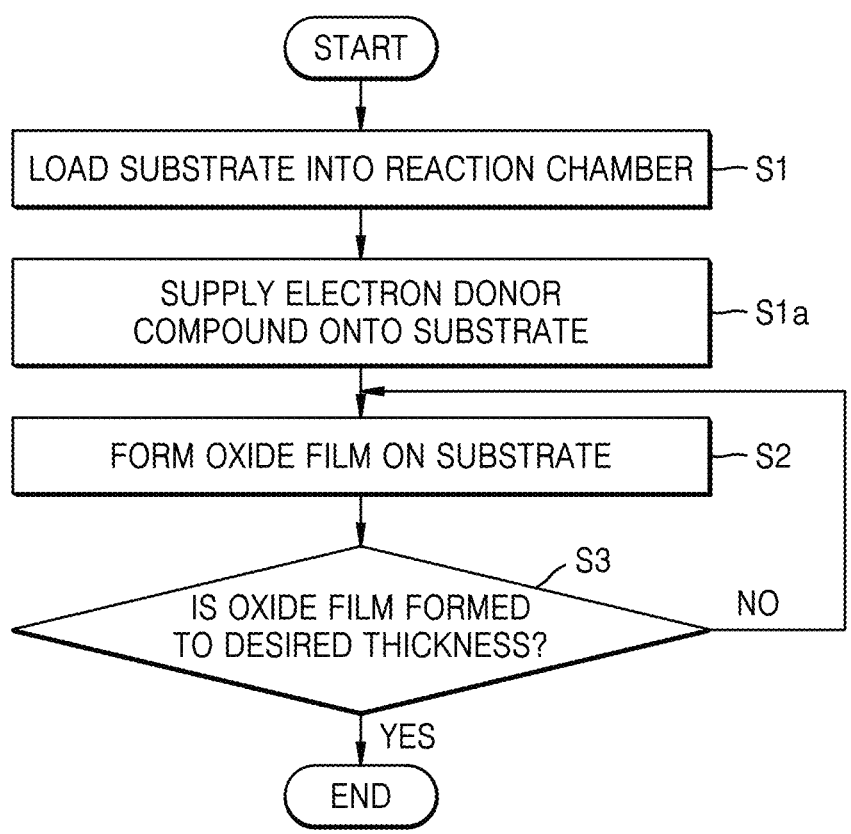
FIG. 7 is a flowchart illustrating a method of forming an oxide, according to an example embodiment.

Referring to FIG. 6G, after the first mold film 214, the second mold film 215, and the filling layer are removed, a capacitor dielectric film 222 may be conformally formed on the lower electrode 220. The capacitor dielectric film 222 may include, for example, a metal oxide and/or a semimetal oxide, which is formed using the method described with reference to FIGS. 2 and 3A to 3D. Hereinafter, a method of manufacturing the capacitor dielectric film 222 will be described in further detail with reference to FIGS. 7 and 8A to 8E. FIG. 7 is a flowchart illustrating a method of forming an oxide, according to an example embodiment. FIGS. 8A to 8E are conceptual diagrams of respective operations of a process of forming an oxide film on the lower electrode 220 of FIG. 6G.

Referring to FIG. 7, to begin with, the substrate 210, on which the lower electrode 220 is formed, may be loaded into a reaction chamber (S1). Since the loading of the substrate 210 into the reaction chamber is described in detail with reference to FIG. 1, additional descriptions will be omitted.

Figure 8A:
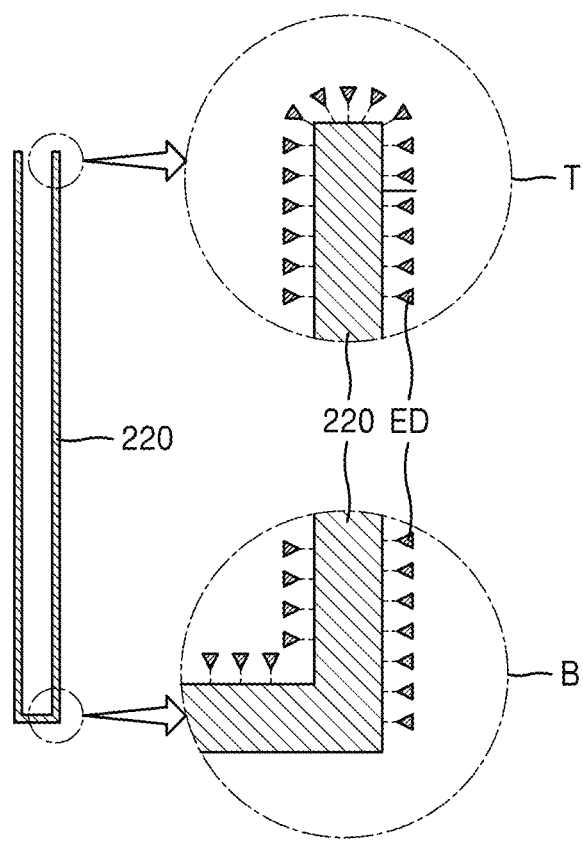
FIGS. 8A to 8E are schematic conceptual diagrams of respective operations of a process of forming an oxide film on a lower electrode of FIG. 6G.

Referring to FIGS. 7 and 8A, an electron donor compound ED may be supplied onto the surface of the lower electrode 220 (S1a). Here, since a target on which an oxide film is to be formed is the lower electrode 220, the lower electrode 220 may serve as a substrate.

The electron donor compound ED may be adsorbed on the surface of the lower electrode 220. Specifically, the electron donor compound ED may be physisorbed on the surface of the lower electrode 220. In some example embodiments, the electron donor compound ED may be bonded to a material of the lower electrode 220 due to van der Waals attraction.

In some example embodiments, a top end T of the lower electrode 220 may be more advantageous in mass transfer than a bottom end B thereof. In this case, a density of the electron donor compound ED adsorbed on the top end T of the lower electrode 220 may be higher than a density of the electron donor compound ED adsorbed on the bottom end B of the lower electrode 220. In other example embodiments, although the top end T of the lower electrode 220 may be upstream in mass transfer than the bottom end B of the lower electrode 220, when a rate-controlling step is a step other than a diffusion step (e.g., an adsorption step), the density of the electron donor compound ED adsorbed on the top end T of the lower electrode 220 may be substantially equal to the density of the electron donor compound ED adsorbed on the bottom end B of the lower electrode 220.

Figure 8B:
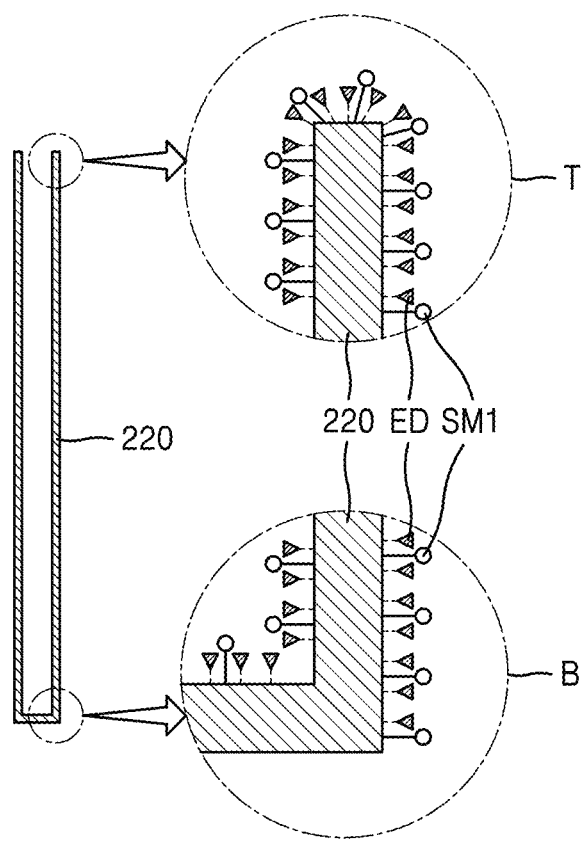

Referring to FIGS. 2, 7, and 8B, a first source material SM1 may be provided on the lower electrode 220.

The first source material SM1 may be chemisorbed on the surface of the lower electrode 220. In addition, the electron donor compound ED may be physisorbed on the lower electrode 220 as described above, and the adsorption of the first source material SM1 may be inhibited to some extent due to the volume of the adsorbed electron donor compound ED. Accordingly, an adsorption rate of the first source material SM1 at the top end T of the lower electrode 220 may be slowed, and a likelihood that the first source material SM1 is diffused to the bottom end B of the first source material SM1 may be increased. As a result, the uniformity of the first source material SM1 adsorbed on the lower electrode 220 may be markedly improved as compared to a case in which the electron donor compound ED is not previously physisorbed.

Figure 8C:
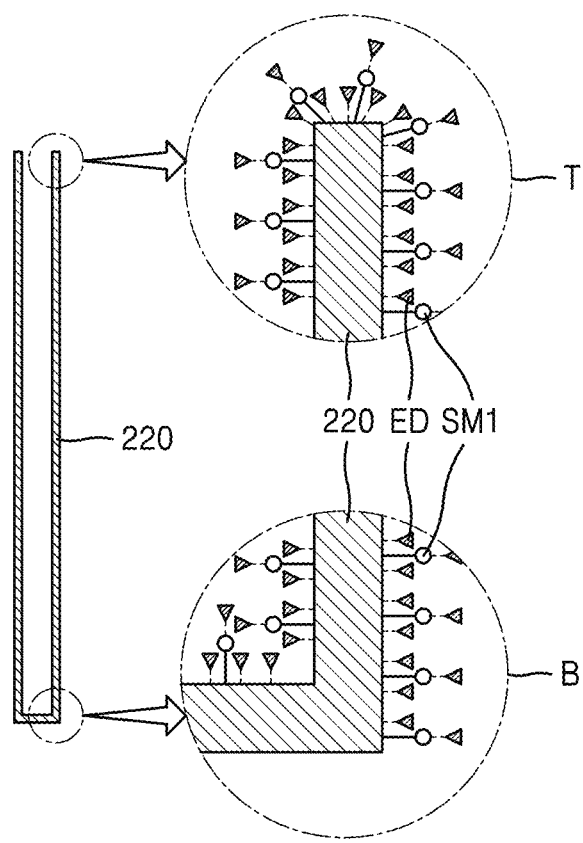

Referring to FIGS. 2, 7, and 8C, an electron donor compound ED may be provided to be bonded to the first source material SM1.

The electron donor compound ED, which is supplied during the current operation, may be selected to be van der Waals-bonded to the first source material SM1. Since the electron donor compound ED has been described above, a detailed description thereof will be omitted.

Since the first source material SM1 is van der Waals-bonded to the electron donor compound ED, the first source material SM1 may be prevented from bonding to a second source material SM2 that is subsequently supplied. That is, when the first source material SM1 is brought into contact with the second source material SM2, ligands of the first and second source materials SM1 and SM2 without the presence of the electron donor compound may react with each other to generate unintended reaction products. The unintended reaction products may become an obstruction to the formation of a uniform oxide film. However, when the first source material SM1 remains bonded to the electron donor compound ED, even if the first source material SM1 is brought into contact with the second source material SM2, the first source material SM1 may not react with the second source material SM2, and the second source material SM2 may be adsorbed on the lower electrode 220 as will be described in further detail below.

Figure 8D:
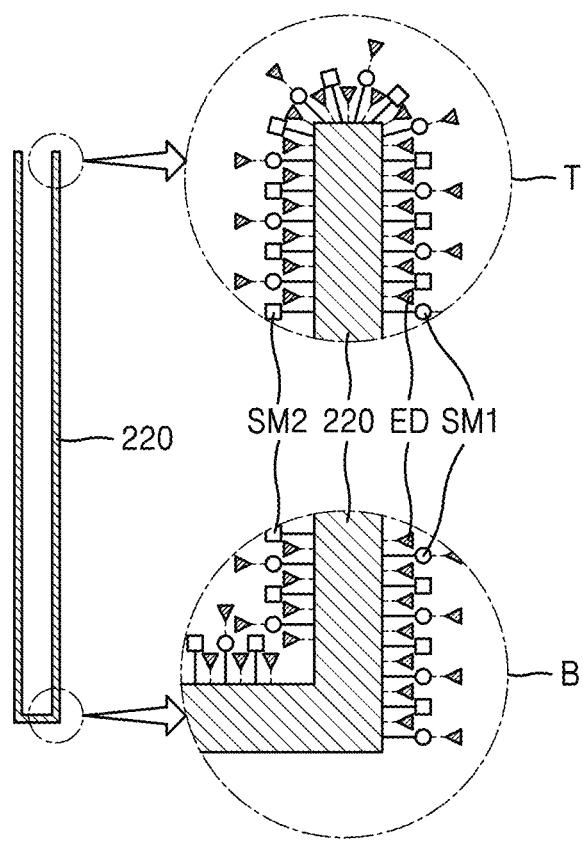

Referring to FIGS. 2, 7, and 8D, the second source material SM2 may be supplied onto the lower electrode 220. The second source material SM2 supplied onto the lower electrode 200 may be chemisorbed on the surface of the lower electrode 200.

Meanwhile, as described above, when the second source material SM2 comes in contact with the first source material SM1, side reactions may cause the generation of products that are difficult to decompose or purge. The generated products may accumulate near an end of an upstream side of a structure having a high aspect ratio, thereby inhibiting the formation of a uniform oxide film. However, when the first source material SM1 is van der Waals-bonded to the electron donor compound ED, as described above, even if the first source material SM1 is brought into contact with the second source material SM2, the side reactions may be hindered or may not occur.

Accordingly, since the reaction between the second source material SM2 and the first source material SM1 may be reduced or prevented, the chance that the second source material SM2 will adsorb on the surface of the lower electrode 220 and diffuse to a downstream side may be increased, and the second source material SM2 may be uniformly chemisorbed on the lower electrode 220.

In the lower electrode 220 shown in FIG. 8D, since the substrate is located under the lower electrode 220 and the material to be deposited is transmitted from an upper side to a lower side, the top end T of the lower electrode 220 may be referred to the upstream, and the bottom end B of the lower electrode 220 may be referred to as the downstream.

Figure 8E:
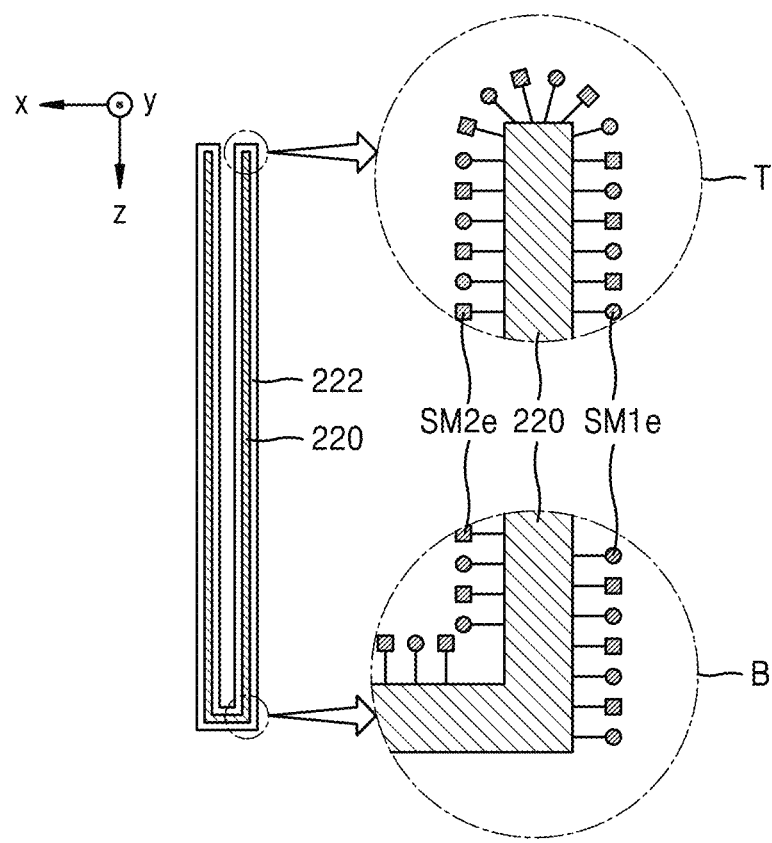

Referring to FIGS. 2, 7, and 8E, an oxidant may be supplied onto the lower electrode 220. The oxidant may remove the electron donor compound ED adsorbed on the lower electrode 220 and the electron donor compound ED adsorbed on the first source material SM1. For example, since the electron donor compound ED includes carbon as a main component, the electron donor compound ED may react with oxygen of the oxidant and be easily removed.

In addition, the ligands of the first source material SM1 and the second source material SM2 may also be removed due to the oxidant, and the first central element SM1e and the second central element SM2e may react with oxygen to form a material film having a composition of $M_xM'_yO_z$. In FIG. 8E, detailed illustration of oxygen (O) is omitted.

As described with reference to FIGS. 2 and 3A to 3D, a cycle including the above-described processes may be repeated a plurality of times and thus, a capacitor dielectric film 222 having a desired thickness may be obtained. For example, the first source material, the electron donor compound, and the second source material, may be deposited through Atomic layer deposition (ALD), and the deposition of the first and second source materials, electron donor compound, and the oxidant may be considered as part of one atomic layer deposition (ALD) cycle, wherein the ALD cycle may be performed a plurality of times to reach the desired thickness for the oxide layer. Here, the desired thickness of the capacitor dielectric film may be determined by the diameter of the opening H, and be a ratio of the internal diameter of the opening H, but the example embodiments are not limited to thus.

Figure 9A:
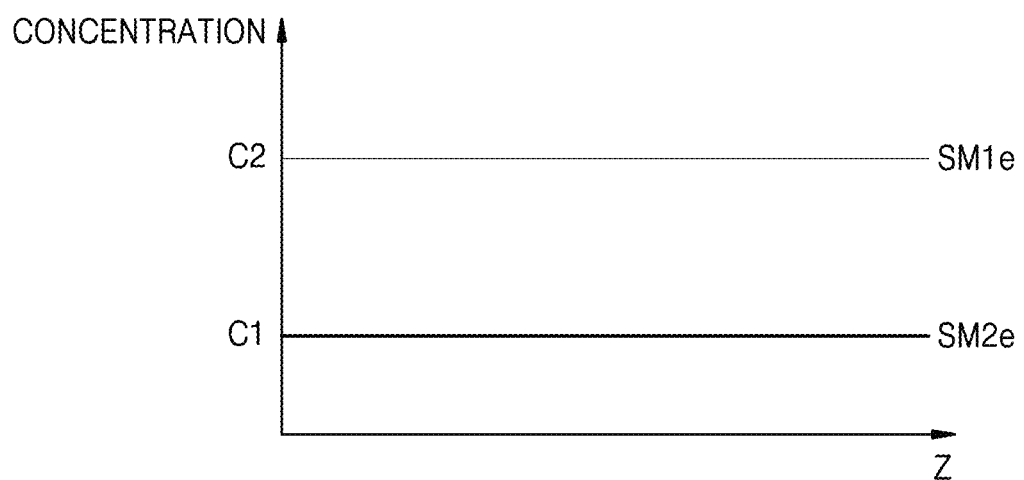
FIG. 9A is a graph schematically illustrating a concentration of a first central element and a concentration of a second central element relative to a z-axial position in a capacitor dielectric film of FIG. 8E.

FIG. 9A is a graph schematically illustrating a concentration C2 of the first central element SM1e and a concentration C1 of the second central element SM2e relative to a z-axial position in the capacitor dielectric film 222 of FIG. 8E such that the origin of the z-axis represents a z-axial position upstream to the mass transfer. Referring to FIG. 9A, it can be seen that the concentration C2 of the first central element SM1e and the concentration C1 of the second central element SM2e are generally constant regardless of the z-axial position. Accordingly, a ratio C2/C1 of the concentration C2 of the first central element SM1e to the concentration C1 of the second central element SM2e may also be almost constant. In some example embodiments, a percentage change of the concentration ratio C2/C1 according to a position may be in the range of about −15% to about +15%.

In addition, a thickness of the capacitor dielectric film 222 may be almost constant regardless of a position, and a step coverage of about 95% or more, about 98% or more, or about 99% or more may be achieved.

Figure 9B:
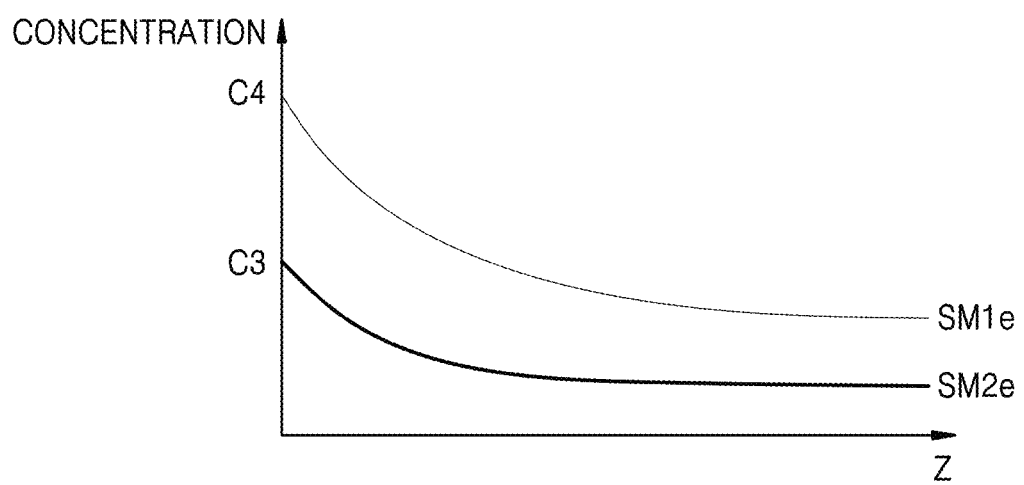
FIG. 9B is a graph schematically illustrating a concentration of a first central element and a concentration of a second central element relative to a z-axial position in a capacitor dielectric film when an operation of adsorbing an electron donor compound on the first source material is omitted.

FIG. 9B is a graph schematically illustrating a concentration of the first central element SM1e and a concentration of the second central element SM2e relative to a z-axial position in the capacitor dielectric film 222 when an operation of adsorbing the electron donor compound ED on the first source material SM1 is omitted. Specifically, the graph of FIG. 9B is obtained in a case in which after the first source material SM1 is adsorbed on the surface of the lower electrode 220, the operation of adsorbing the electron donor compound ED on the first source material SM1 is omitted, and the second source material SM2 is directly supplied.

Referring to FIG. 9B, the concentrations of the first central element SM1e and the second central element SM2e may gradually increase toward an upstream side, while the concentrations of the first central element SM1e and the second central element SM2e may be gradually reduced far from the upstream side.

In addition, ratios of the first central element SM1e and the second central element SM2e may vary according to a z-axial position and thus, it may be difficult to control dispersion, and electrical properties of a semiconductor device may be non-uniform.

Figure 6H:
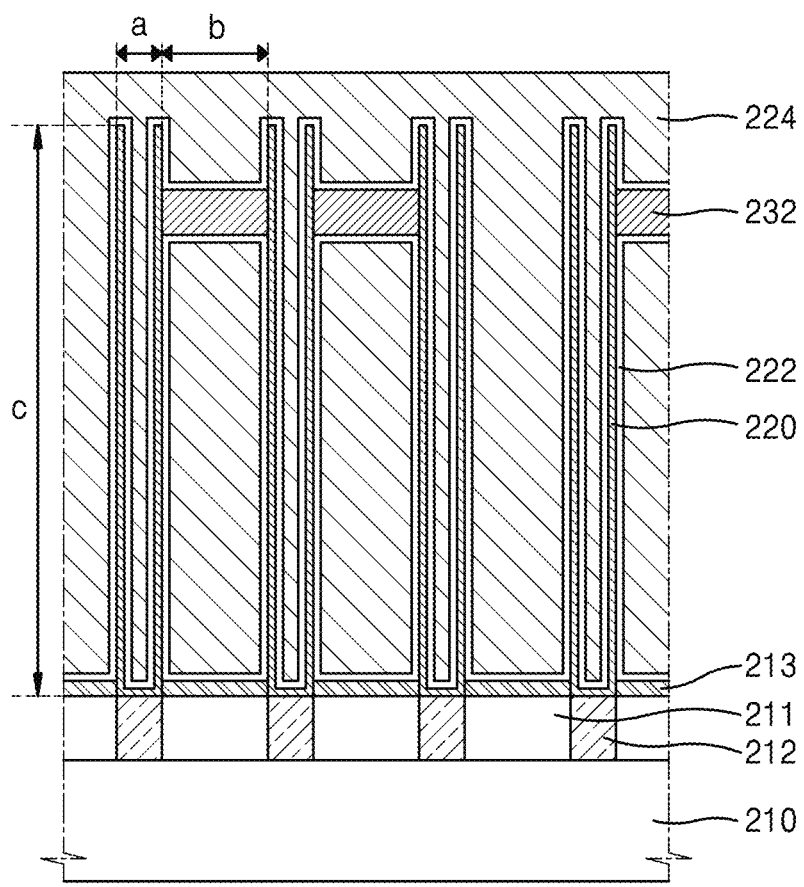

Referring to FIG. 6H, an upper electrode 224 may be formed on the capacitor dielectric film 222, thereby forming a capacitor. The upper electrode 224 may include, for example, a semiconductor material such as doped poly-Si; a metal such as ruthenium (Ru), iridium (Ir), titanium (Ti), and/or tantalum (Ta); a conductive metal nitride such as titanium nitride (TiN), tantalum nitride (TaN), and tungsten nitride (WN); a conductive metal oxide such as iridium oxide (IrO); and/or a composite material thereof. The upper electrode 224 may include a single layer or a stacked structure of at least two layers.

An aspect ratio AR of the lower electrode 220 may be defined by Equation 1:

$$AR = c / \min(a, b) \quad (1),$$

wherein a denotes an inner diameter of the lower electrode 220, b denotes a distance between the lower electrodes 220, c denotes a vertical height of an outer surface of the lower electrode 220, and min(a, b) denotes a smaller number of a and b.

The aspect ratio AR of the lower electrode 220 may be, for example, 30 or higher, or 45 or higher. For instance, the aspect ratio AR of the lower electrode 220 may range from about 30 to about 200, about 40 to about 150, about 45 to about 120, about 50 to about 100, or about 55 to about 80.

Furthermore, a ratio of a smallest thickness of the capacitor dielectric film 222 formed on the surface of the lower electrode 220 to a greatest thickness of the capacitor dielectric film 222 may be about 0.85 or higher, or about 0.9 or higher or about 0.93 or higher, or about 0.95 or higher, about 0.96 or higher, about 0.97 or higher, about 0.98 or higher, or about 0.99 or higher.

Figure 10A:
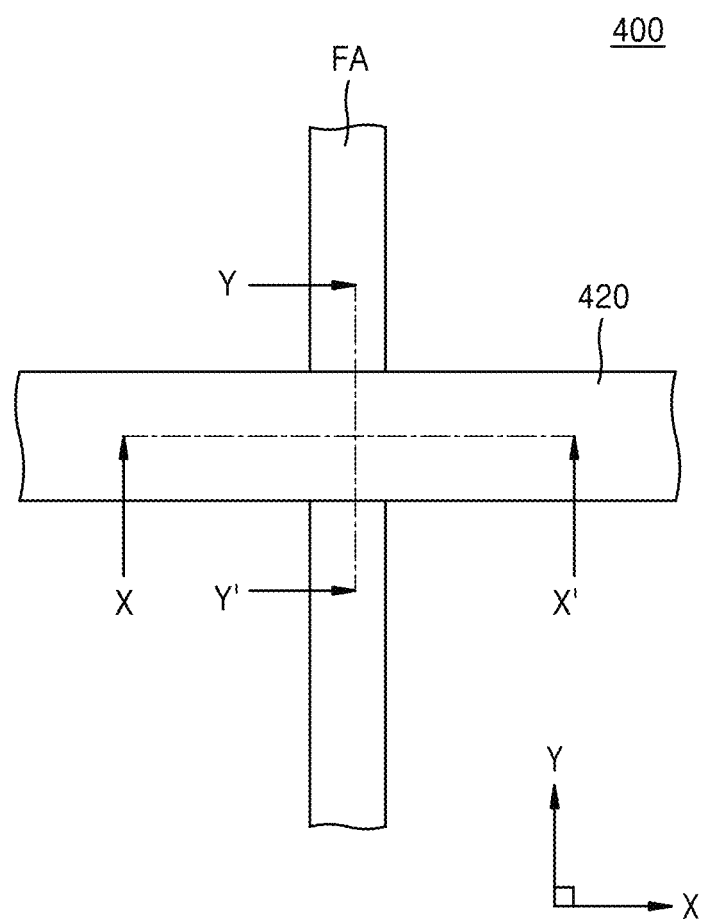
Figure 10B:
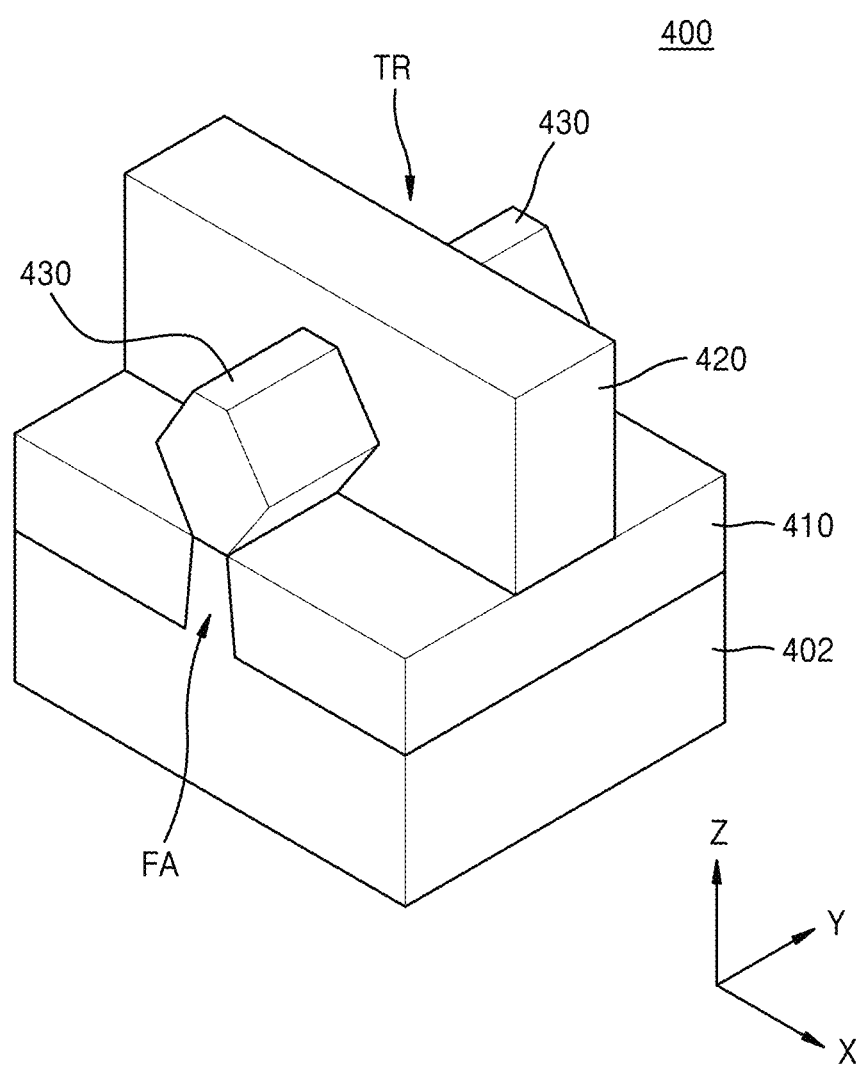
Figure 10C:
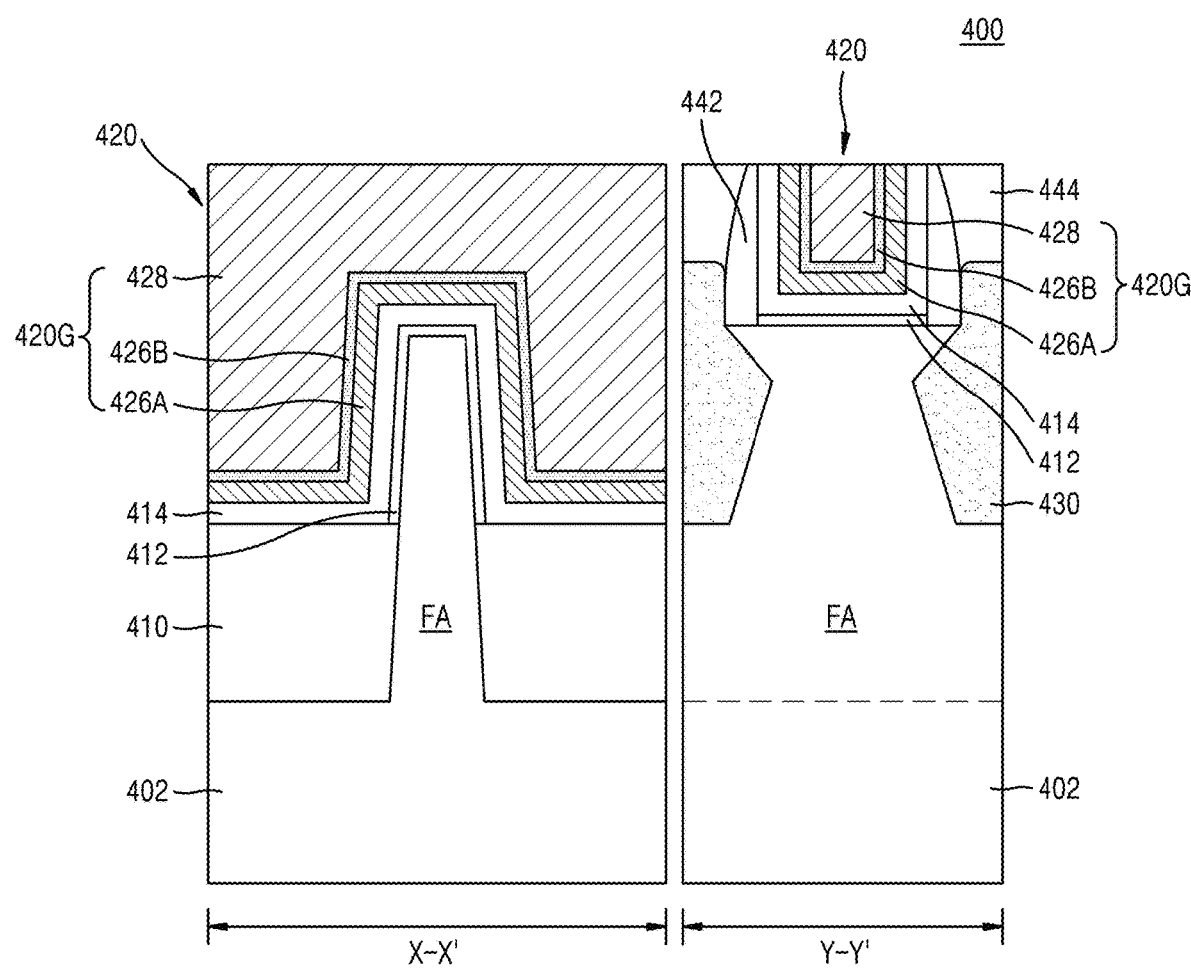

FIGS. 10A to 10C are diagrams illustrating a method of manufacturing a semiconductor device 400, according to an example embodiment. FIG. 10A is a plan view of the semiconductor device 400 to be formed. FIG. 10B is a perspective view of the semiconductor device 400 of FIG. 10A. FIG. 10C is a cross-sectional view of sectional structures taken along lines X-X' and Y-Y' of FIG. 10A.

Referring to FIGS. 10A to 10C, the semiconductor device 400 may include a fin-type active region FA, which may protrude from a substrate 402.

Since the substrate 402 is substantially the same as the substrate 210 described with reference to FIG. 6A, detailed descriptions thereof are omitted here.

The substrate 402 may include a Group III-V material or a Group IV material and be used as a material for a channel of a high-power high-speed transistor. When an NMOS transistor is formed on the substrate 402, the substrate 402 may include any one of Group III-V materials. For example, the substrate 402 may include GaAs. When a PMOS transistor is formed on the substrate 402, the substrate 402 may include a semiconductor material (e.g., germanium) having a higher hole mobility than a silicon substrate.

The fin-type active region FA may extend in one direction (e.g., the Y direction in FIGS. 10A and 10B). A device isolation layer 410 may be formed on the substrate 402 to cover a lower sidewall of the fin-type active region FA. The fin-type active region FA may protrude as a fin type on the device isolation layer 410. In some example embodiments, the device isolation layer 410 may be a dielectric, and may include a silicon oxide film, a silicon nitride film, a silicon oxynitride film, or a combination thereof, but the inventive concepts are not limited thereto.

A gate structure 420 may be formed on the substrate 410 and extend over the fin-type active region FA in a direction (e.g., the X direction) that intersects with an extension direction of the fin-type active region FA. One pair of source and drain regions 430 may be formed in the fin-type active region FA on both sides of the gate structure 420.

The one pair of source and drain regions 430 may include a semiconductor layer that is epitaxially grown from the fin-type active region FA. Each of the one pair of source and drain regions 430 may have an embedded silicon germanium (SiGe) structure including a plurality of epitaxially grown silicon germanium layers, an epitaxially grown silicon layer, or an epitaxially grown silicon carbide (SiC) layer. FIG. 10B illustrates a case in which the one pair of source and drain regions 430 have a specific shape, but a sectional shape of each of the one pair of source and drain regions 430 is not limited to that shown in FIG. 10B and have various shapes. For example, the one pair of source and drain regions 430 may have various sectional shapes, such as a circular sectional shape, an elliptical sectional shape, or a polygonal sectional shape.

A MOS transistor TR may be formed at an intersection between the fin-type active region FA and the gate structure 420. The MOS transistor TR may include a three-dimensional (3D) MOS transistor having channels formed on a top surface and two side surfaces of the fin-type active region FA. The MOS transistor TR may constitute an NMOS transistor or a PMOS transistor.

As shown in FIG. 10C, the gate structure 420 may include an interface layer 412, a high-k dielectric film 414, a first metal-containing layer 426A, a second metal-containing layer 426B, and a gap-fill metal layer 428, which may be sequentially formed on the surface of the fin-type active region FA. Among the gate structure 420, the first metal-containing layer 426A, the second metal-containing layer 426B, and the gap-fill metal layer 428 may constitute a gate electrode 420G.

Insulating spacers 442 may be formed on both side surfaces of the gate structure 420. An interlayer insulating layer 444 may be formed opposite to the gate structure 420 across the insulating spacers 442 to cover the insulating spacers 442.

The interface layer 412 may be formed on the surface of the fin-type active region FA. The interface layer 412 may include an insulating material, such as an oxide film, a nitride film, or an oxynitride film. The interface layer 412 may constitute a gate insulating film along with the high-k dielectric film 414.

The high-k dielectric film 414 may include a material having a higher dielectric constant than a silicon oxide film. In some example embodiments, the high-k dielectric film 414 may include at least two of silicon (Si), strontium (Sr), barium (Ba), titanium (Ti), lead (Pb), zirconium (Zr), and hafnium (Hf). For example, the high-k dielectric film 414 may have a dielectric constant of about 4 to about 100. The high-k dielectric film 414 may include a combination of oxidized metals and/or semimetals, for example, zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but a material forming the high-k dielectric film 414 is not limited thereto.

The high-k dielectric film 414 may be formed by using an atomic layer deposition (ALD) process. The high-k dielectric film 414 may be formed by the method of forming the oxide film as described with reference to FIGS. 1 to 3D and 5A to 5F.

In some example embodiments, the first metal-containing layer 426A may include titanium nitride, tantalum nitride, titanium oxynitride, or tantalum oxynitride. For example, the first metal-containing layer 426A may include TiN, TaN, TiAlN, TaAlN, TiSiN, or a combination thereof. The first metal-containing layer 426A may be formed by using various deposition methods, such as an ALD process, a chemical vapor deposition (CVD) process, or a physical vapor deposition (PVD) process.

The first metal-containing layer 426A may include a single layer or a multilayered structure.

In some example embodiments, the second metal-containing layer 426B may include an N-type metal-containing layer required for an NMOS transistor including an aluminum compound containing titanium or tantalum. For example, the second metal-containing layer 426B may include titanium aluminum carbide (TiAlC), titanium aluminum nitride (TiAlN), titanium aluminum carbonitride (TiAlCN), titanium aluminide (TiAl), tantalum aluminum carbide (TaAlC), tantalum aluminum nitride (TaAlN), tantalum aluminum carbonitride (TaAlCN), tantalum aluminide (TaAl), or a combination thereof.

In some other example embodiments, the second metal-containing layer 426B may include a p-type metal-containing layer required for a PMOS transistor. For example, the second metal-containing layer 426B may include at least one of molybdenum (Mo), palladium (Pd), ruthenium (Ru), platinum (Pt), titanium nitride (TiN), tungsten nitride (WN), tantalum nitride (TaN), iridium (Ir), tantalum carbide (TaC), ruthenium nitride (RuN), and molybdenum nitride (MoN).

The second metal-containing layer 426B may include a single layer or a multilayered structure.

The second metal-containing layer 426B may serve to control a work function of a gate structure 420 along with the first metal-containing layer 426A. A threshold voltage of the gate structure 420 may be controlled by adjusting work functions of the first metal-containing layer 426A and the second metal-containing layer 426B. In some example embodiments, any one of the first metal-containing layer 426A and the second metal-containing layer 426B may be omitted.

When the gate structure 420 is formed by a replacement metal gate (RMG) process, the gap-fill metal layer 428 may be formed to fill the remaining gate space on the second metal-containing layer 426B. After the second metal-containing layer 426B is formed, when there is no remaining gate space on the second metal-containing layer 426B, the gap-fill metal layer 428 may not be formed on the second metal-containing layer 426B but omitted.

The gap-fill metal layer 428 may include a material selected from the group consisting essentially of tungsten (W), a metal nitride (e.g., TiN and TaN), aluminum (Al), a metal carbide, a metal silicide, a metal aluminum carbide, a metal aluminum nitride, and a metal silicon nitride.

In the method of manufacturing the semiconductor device 400 as described with reference to FIGS. 10A to 10C, the high-k dielectric film 414 may be formed by using a method of forming an oxide film, according to example embodiments. That is, the formation of the high-k dielectric film 414 may include forming an adsorption layer of a combination of a first source material and an electron donor compound on the fin-type active region FA in which the interface layer 412 is formed, forming an adsorption layer of a second source material, and supplying an oxidant to form an oxide film containing at least two central atoms.

The method of manufacturing the semiconductor device 400 including the FinFET including the 3D channel has been described with reference to FIGS. 10A to 10C, but the inventive concepts is not limited thereto. For example, it will be clearly understood by one of ordinary skill in the art that methods of manufacturing semiconductor devices including planar MOSFETs having characteristics according to example embodiments may be provided by making various changes in form and details to the above-described example embodiments within the spirit and scope of the inventive concepts.

Figure 11:
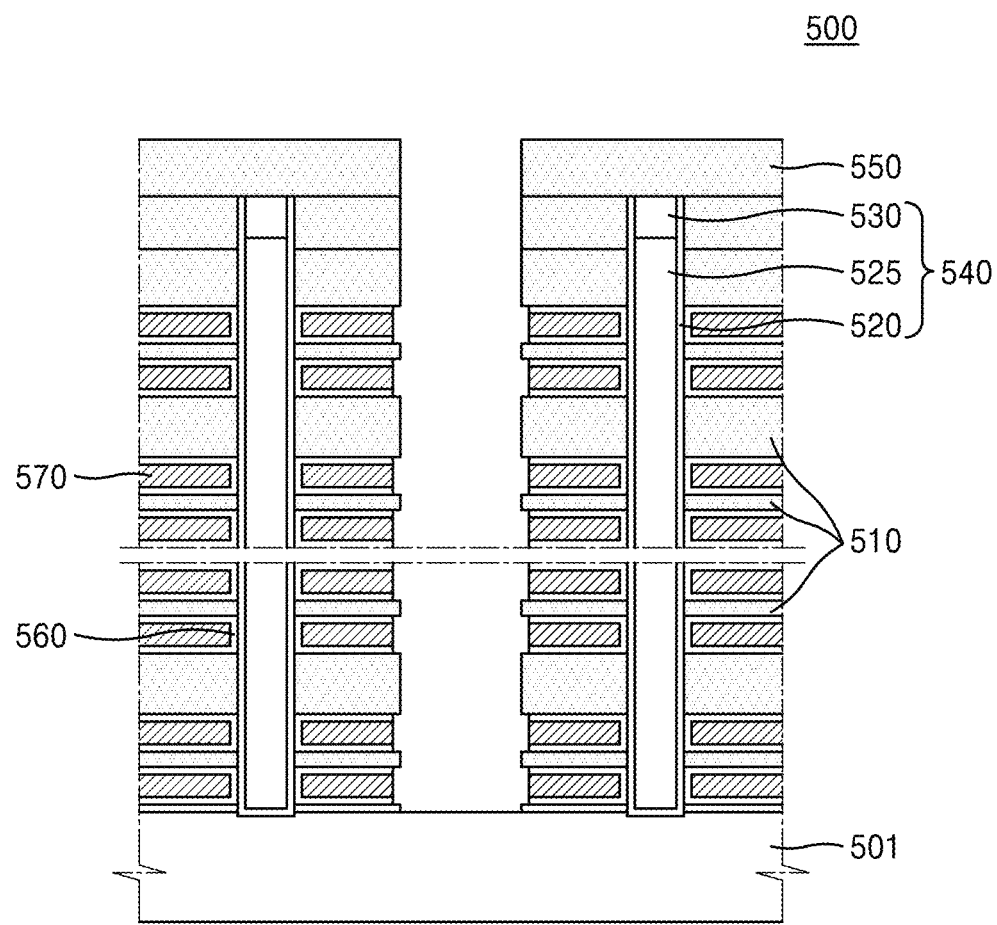
FIG. 11 is a cross-sectional view of another example of a semiconductor device formed by using a method of manufacturing a semiconductor device according to an example embodiment.

FIG. 11 is a cross-sectional view of another example of a semiconductor device formed by a method of manufacturing a semiconductor device 500 according to an example embodiment.

Referring to FIG. 11, interlayer insulating films 510 may be vertically stacked on a semiconductor substrate 501. Conductive patterns 570 may be interposed between the interlayer insulating films 510.

Vertical structures 540 may pass through the conductive patterns 570 and the interlayer insulating films 510. Each of the vertical structures 540 may include a core pattern 525, a pad pattern 530, and an outer pattern 520 that surrounds a side surface of the core pattern 525 and extends on a side surface of the pad pattern 530.

The core pattern 525 may include an insulating material, such as silicon oxide.

The pad pattern 530 may be located on the core pattern 525 at a higher level than an uppermost conductive pattern of the conductive patterns 570. The pad pattern 530 may include a conductive material, such as doped poly-Si.

The outer pattern 520 may include a semiconductor pattern that may serve as a channel of a transistor. For example, the outer pattern 520 may include a semiconductor material, such as silicon. A portion of the outer pattern 520, which is near to the conductive patterns 570, may include a dielectric material. The dielectric material may include a material (e.g., silicon oxide) that may serve as a tunnel oxide film of a transistor. The dielectric material may include a material (e.g., silicon nitride or a high-k dielectric material) capable of storing information of a flash memory device. The dielectric material may be formed by a method of forming an oxide film, according to example embodiments.

Meanwhile, the conductive patterns 570 may include a metal nitride film and/or a metal film. For example, each of the conductive patterns 570 may include a metal film and a metal nitride film interposed between the metal film and the interlayer insulating films 510. Also, the metal nitride film may extend between the metal film and the vertical structure 540. The conductive patterns 570 may be formed by a method of forming a material film according to example embodiments.

A capping insulating film 550 may be provided to cover the interlayer insulating film 510 and the vertical structure 540.

While the inventive concepts have been particularly shown and described with reference to example embodiments thereof, it will be understood that various changes in form and details may be made therein without departing from the spirit and scope of the following claims.

What is claimed is:

1. A method of forming an oxide film including two non-oxygen elements, the method comprising:
providing an electron donor compound on a substrate;
providing a first source material on the substrate, the first source material comprising a first central element; and
providing an oxidant on the substrate to form an oxide film,
wherein the electron donor includes an unshared electron pair or includes a double bond or a triple bond.

2. The method of claim 1, wherein
the providing of the electron donor compound on the substrate is performed before the providing the first source material on the substrate.

3. The method of claim 2, further comprising:
providing a second source material on the substrate before the providing of the electron donor compound on the substrate, the second source material comprising a second central element.

4. The method of claim 3, wherein
the providing of the second source material on the substrate at least partially overlaps the providing of the electron donor compound in time.

5. The method of claim 2, wherein
the electron donor compound includes an oxygen-containing, nitrogen-containing, sulfur-containing, or phosphorus-containing hydrocarbon compound having an unshared electron pair.

6. The method of claim 5, wherein
the electron donor compound comprises at least one of a C1-C10 alcohol compound, a C2-C10 ether compound, a C3-C10 ketone compound, a C6-C12 aryl compound, a C3-C15 allyl compound, a C4-C15 diene compound, a C5-C20 β-diketone compound, a C5-C20 β-ketoimine compound, a C5-C20 β-diimine compound, ammonia, a C1-C10 amine compound, a C1-C10 thiol compound, and a C2-C10 thioether compound.

7. The method of claim 1, further comprising:
providing the electron donor compound on the substrate after the providing of the first source material on the substrate and before the providing of the oxidant.

8. The method of claim 1, wherein
the oxidant comprises at least one of $H_2O$, $O_2$, $O_3$, $N_2O$, NO, $NO_2$, $N_2O_4$, $H_2O_2$, C1-C10 alcohol, C2-C10 ether, C3-C10 ketone, C1-C10 carboxylic acid, and C1-C10 ester.

9. A method of forming a dielectric film, the method comprising:
providing a substrate into a reaction chamber; and
repeating a deposition cycle until a dielectric film is formed on the substrate to a set thickness,
wherein the deposition cycle comprises:
providing a first source material on the substrate, the first source material comprising a first central element;
providing an electron donor compound on the substrate;
providing a second source material on the substrate after the providing of the electron donor compound, the second source material comprising a second central element; and
providing an oxidant on the substrate.

10. The method of claim 9, wherein
the providing of the first source material on the substrate at least partially overlaps the providing of the electron donor compound in time.

11. The method of claim 10, wherein
the providing of the electron donor compound ends after the providing of the first source material on the substrate ends.

12. The method of claim 11, wherein
the providing of the electron donor compound starts before the providing of the first source material on the substrate starts.

13. The method of claim 9, wherein the deposition cycle further comprises:
providing the electron donor compound after the providing of the second source material on the substrate and before the providing of the oxidant.

14. The method of claim 9, wherein the deposition cycle further comprises:
providing the electron donor compound before the providing of the first source material on the substrate.

15. The method of claim 14, wherein the deposition cycle further comprises:
providing the electron donor compound after the providing of the second source material on the substrate and before the providing of the oxidant.

16. The method of claim 9, wherein, in the deposition cycle,
the providing of the electron donor compound on the substrate is performed before the providing of the first source material on the substrate, and
the providing of the second source material on the substrate is performed after the providing of the first source material on the substrate.

17. The method of claim 16, wherein
the providing of the oxidant on the substrate is performed after the providing of the second source material on the substrate.

18. A method of manufacturing a semiconductor device, the method comprising:
forming a lower electrode that is electrically connected to an active region of a semiconductor substrate;
forming a dielectric film on an exposed surface of the lower electrode; and
forming an upper electrode on the dielectric film,
wherein the forming of the dielectric film comprises repeating a deposition cycle until the dielectric film is formed to a desired thickness, and
wherein the deposition cycle includes:
providing an electron donor compound on the lower electrode;
providing a first source material on the lower electrode after the providing of the electron donor compound, the first source material comprising a first central element; and
providing an oxidant on the lower electrode.

19. The method of claim 18, further comprising:
providing a second source material on the lower electrode, the second source material comprising a second central element different from the first central element.

20. The method of claim 19, wherein
the electron donor compound is capable of forming a van der Waals bond with the first source material and/or the second source material.

* * * * *